(12) United States Patent
Rodriguez et al.

(10) Patent No.: US 9,098,288 B1
(45) Date of Patent: Aug. 4, 2015

(54) INTERACTIVE DESIGN ENVIRONMENT HAVING DESIGN TOOL PORTION AND DENSITY DISPLAY PORTION

(71) Applicant: The MathWorks, Inc., Natick, MA (US)

(72) Inventors: Julia Argentina Granada Rodriguez, Needham, MA (US); Ashok Ruman Charry, Shrewsbury, MA (US); Darel Allen Linebarger, Southborough, MA (US)

(73) Assignee: The MathWorks, Inc., Natick, MA (US)

( * ) Notice: Subject to any disclaimer, the term of this patent is extended or adjusted under 35 U.S.C. 154(b) by 358 days.

(21) Appl. No.: 13/746,899

(22) Filed: Jan. 22, 2013

Related U.S. Application Data

(63) Continuation of application No. 12/924,660, filed on Oct. 1, 2010, now Pat. No. 8,365,088.

(51) Int. Cl.
  *G06F 3/00* (2006.01)
  *G06F 9/44* (2006.01)

(52) U.S. Cl.
  CPC ........................................ *G06F 8/34* (2013.01)

(58) Field of Classification Search
  None
  See application file for complete search history.

(56) References Cited

U.S. PATENT DOCUMENTS

| | | | |
|---|---|---|---|
| 2003/0231194 A1* | 12/2003 | Morgan et al. | 345/691 |
| 2005/0015755 A1* | 1/2005 | Holmes et al. | 717/136 |
| 2012/0151182 A1* | 6/2012 | Madajczak | 712/5 |
| 2012/0213001 A1* | 8/2012 | Yang | 365/185.2 |

* cited by examiner

*Primary Examiner* — Boris Pesin
*Assistant Examiner* — Ayesha Huertas Torres
(74) *Attorney, Agent, or Firm* — Nelson Mullins Riley & Scarborough LLP

(57) ABSTRACT

Exemplary embodiments provide an interactive tool that allows users to design and evaluate storage mechanisms while program code executes. For example, an embodiment uses compact histogram density scales (CHDS's) to display count information for bins making up the storage mechanism (e.g., a register). The user can determine whether counts are within a desirable range, exceeding an overflow threshold, or exceeding an underflow threshold for a bin. Embodiments allow the user to observe overflow/underflow thresholds, signedness, word lengths, fraction lengths, etc., while program code that interacts with the register executes.

20 Claims, 40 Drawing Sheets

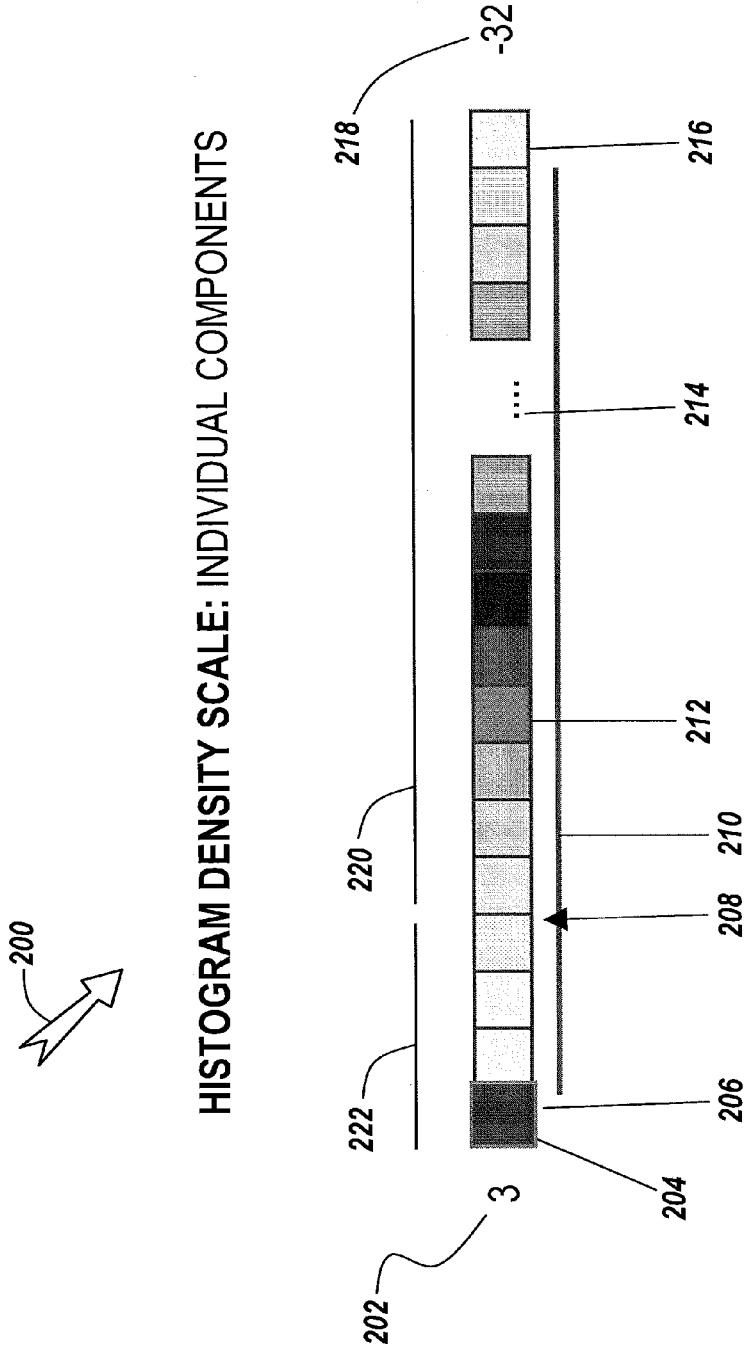

202 — 1. Most Significant Bin (MSB) - Power 2 scaling
204 — 2. Overflow Indicator - Lighter shades of red indicate lower overflow counts. Darker shades of red indicate higher overflow counts.
222 — 2a. Integer Bin - Bins values that are whole numbers.
206 — 3. Signed Bit Indicator - The presence of the orange outline around the Histogram Density Bin indicates the signedness of the fixed-point type.
208 — 4. Radix Point - Indicates the boundary between the Integer Bin and Fractional Bins.
210 — 5. Word Length Line, or Word Length Indicator - Visual affordance of the word length of the fixed-point type.
212 — 6. In-range Indicator - Lighter shades of blue indicate low counts binned data. Darker shades of blue indicate high counts of binned data.
214 — 7. Continuity - Indicates a longer Histogram Density Scale that can not fit into the allotted column width.
216 — 8. Underflow Indicator - Lighter shades of yellow indicate lower underflow counts. Darker shades of yellow indicate higher underflow counts.
220 — 8a. Fractional Bins - Bin values that are fractional quantities
218 — 9. Least Significant Bin (LSB) - Power 2 scaling
224 — 10. Histogram Density Bin - Unit of the histogram density scale that represents binned data.
226 — 11. Bin Label - Power 2 scaling
228 — 12. Signedness Indicator - Textual communication of negative power 2 scaling of MSB.
230 — 13. Binned Data - Statistical information of binned value that textually indicates the count and percent of total values present in the bin.
232 — 14. Interactive Bin Selector - Word Length Line in the interactive state allows to graphically change the word, integer, and fraction length.
234 — 14a. Interactive Bin Selector Display - Textual communication of the current word and fraction length available to the user upon mouseover.
236 — 14b. Fractional Length Resizer - Allows to graphically change the fractional length
238 — 14c. Integer Length Resizer - Allows to graphically change the integer length

*Fig. 2B*

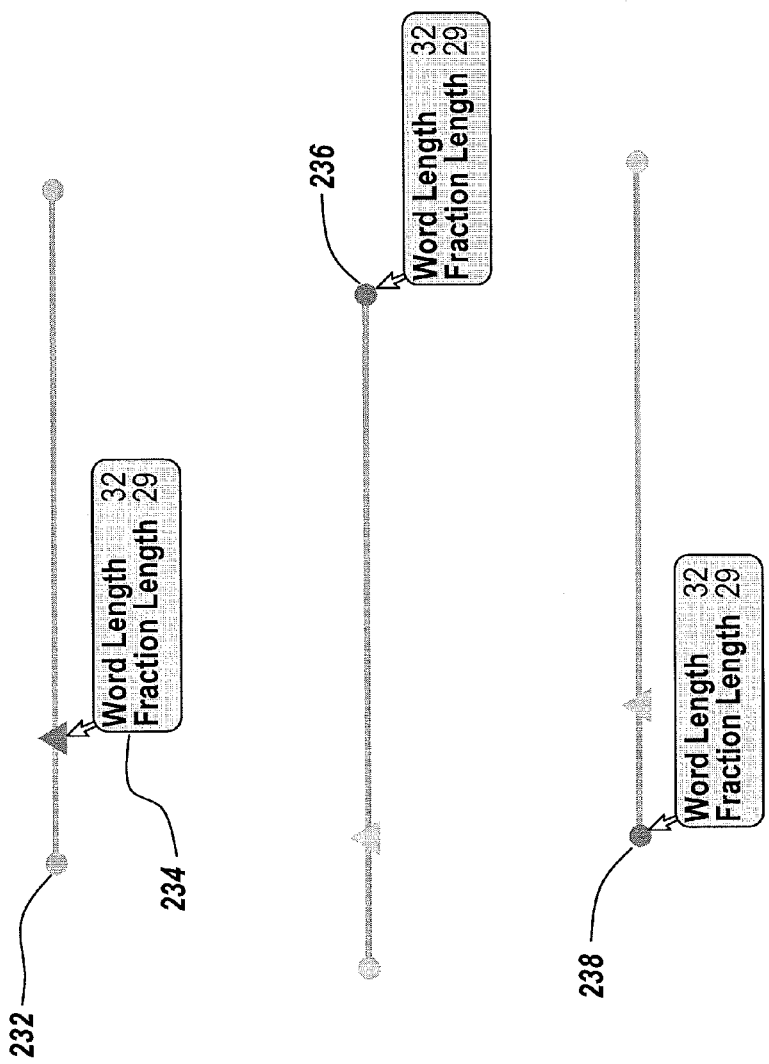

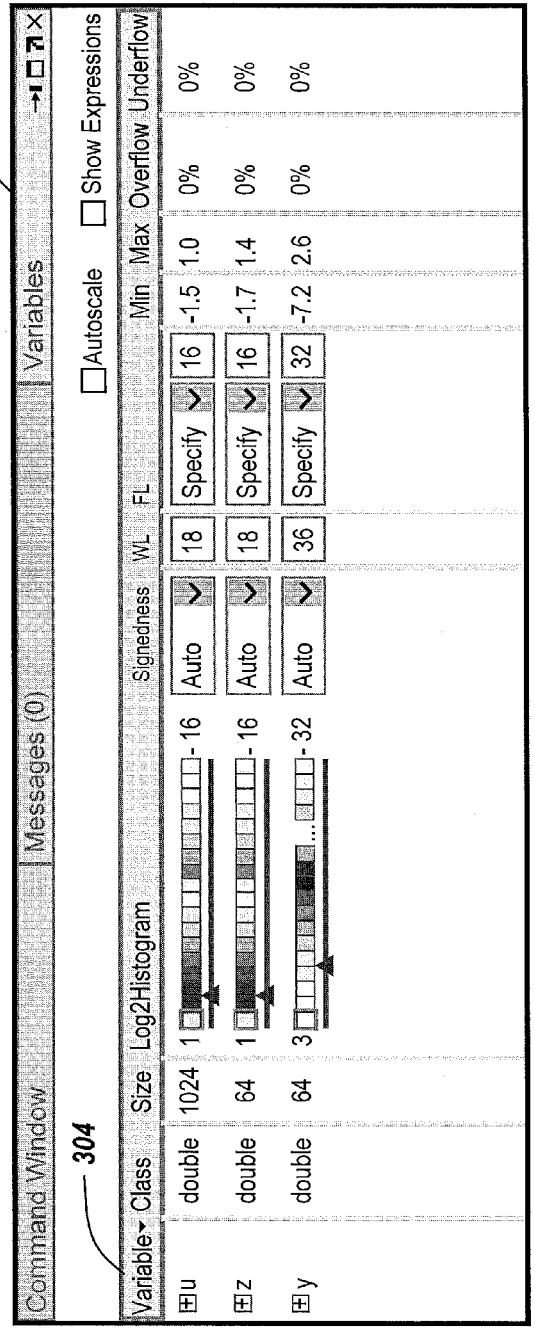

INTERACTIVE DESIGN ENVIRONMENT HAVING DESIGN TOOL PORTION AND DENSITY DISPLAY PORTION

BACKGROUND INFORMATION

Techniques exist for displaying information to computer users in ways that allow the users to gain an understanding about characteristics of information making up a display. For example, computer users employing design tools, such as tools for designing fixed or floating point computing systems, may wish to display information about the number of times a particular bit in a register is written or read. Continuing with the example, a user may be working with a fixed point register having a width of 8 bits. When designing a system that will use the register, the user may wish to know how many times each of the 8 bits is written or read for a particular design. In this example, the user may run a simulation of the system and then access simulation results containing data written to and read from the register as well as information about other register interactions.

In conventional design systems, the user may visualize simulation results/information using histogram displays that show a number of occurrences or events associated for each bit, or bin, of the register. The amplitude of displayed information in the histogram may vary depending on the number of occurrences for a respective bin. When a user is working with systems having more than one register, the user may have to toggle between histograms for each register because histogram displays typically take up a relatively large portion of an available display area. For example, when histograms are displayed in a small window, information displayed in the histogram can become so compressed that a user cannot glean relevant simulation details from the small window.

Toggling between appropriately sized histogram display windows can make it difficult for the user to make comparisons from one register to another because information for the two or more registers cannot be displayed simultaneously. Also, one or more histogram display windows may occupy so much display area that the user may be unable to display other types of information that might be useful for determining whether a design is satisfactory. For example, a user may wish to see code associated with variables stored in the registers, debugging information associated with the registers, overflow and/or underflow information for the registers, etc. The user may be unable to view adequate quantities/types of other information because the histogram display windows occupy too much of the available display area.

BRIEF DESCRIPTION OF THE DRAWINGS

The accompanying drawings, which are incorporated in and constitute a part of this specification, illustrate one or more embodiments of the invention and, together with the description, explain the invention. In the drawings.

FIG. 2A illustrates an exemplary compact histogram density scale that can be used with embodiments of the invention;

FIG. 2B illustrates an exemplary legend that can be used to provide information about aspects of a compact histogram density scale display;

FIG. 2D illustrates exemplary bin selector features that can be used to display and/or manipulate information associated with a histogram density scale;

FIGS. 4A-4C illustrate an exemplary implementation of a compact histogram density scale display that can be used to display information about variables in a program;

DETAILED DESCRIPTION

Figure 1:
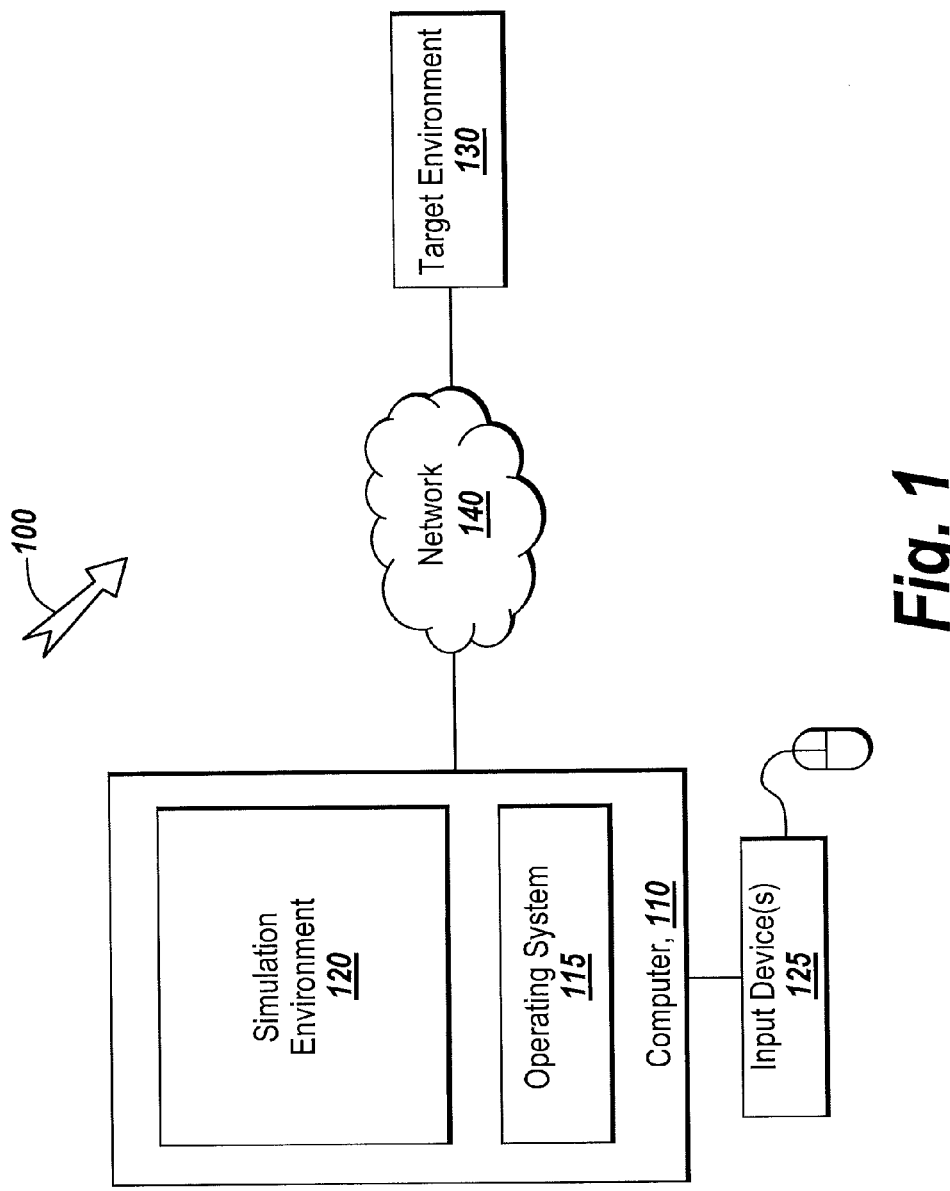
FIG. 1 illustrates an exemplary system for practicing embodiments of the invention.

The following detailed description of implementations consistent with principles of the invention refers to the accompanying drawings. The same reference numbers in different drawings may identify the same or similar elements. Also, the following detailed description does not limit the invention. Instead, the scope of the invention is defined by the appended claims and their equivalents.

Overview

Exemplary embodiments provide an interactive design and/or analysis environment for allowing a user to design and evaluate systems employing storage mechanisms, such as registers. For example, a user may be designing an embedded system that makes use of four fixed-point registers for storing information in the embedded device. The user may wish to use the smallest register size (e.g., register having the fewest number of bits) to minimize manufacturing costs and to improve performance of the embedded device. A satisfactory design may require that the selected register size does not exceed a threshold for overflows or underflows in the bits, making up the register.

Conventional design techniques and tools may force a user to perform iterative design attempts to come up with a smallest register size that satisfies design criteria. For example, the user may need to pick a register size, simulate the embedded system by running code for the system, and then access simulation results to determine whether any bins had overflows or underflows, and if so whether the number of overflows/underflows was acceptable. When a selected register size is determined to be inadequate, the user may have to manually pick a larger register size. In other situations, the user may have to manually move the radix point within a register to vary the integer length (the register portion to the left of the radix point) with respect to the fraction length (the register portion to the right of the radix point).

The user of a conventional technique/tool may have to rerun the simulation using the new register size and/or word/fraction lengths to produce a new simulation result. The user may have to manually access the simulation result and, for example, look at a conventional histogram display for each register of the embedded system by cycling through individual histogram display windows using a pointing mechanism or technique, such as a mouse, track ball, touch sensitive display, etc.

Exemplary embodiments of the invention allow a user to interactively design, analyze and/or simulate systems employing storage mechanisms, such as registers representing fixed-point data types. Exemplary embodiments allow a user to simulate a system having a plurality of registers using a model. Embodiments further allow the user to observe information about bins making up the registers while a simulation of the system progresses. For example, an embodiment can provide a compact histogram density scale (CHDS) display for four fixed-point registers used in an embedded system simulation. The embodiment may use representations of the registers with the model as opposed to actual hardware registers. Alternatively, the embodiment can be configured to interact with actual hardware registers if desired.

The CHDS displays can present a user with information about the number of times data is written to respective bins making up a register. For example, a CHDS can be used to log data at a number of sample times when values for the data change with each write and when values for the data do not change. Embodiments may allow a user to determine how many times a value for data in a bin changed, how many times data for the bin was written, etc.

Embodiments can further represent types of information or occurrences of events using display techniques such as varying colors, varying intensities of colors, varying patterns or shadings, varying symbols, etc. The CHDS allows the user to view the four registers at the same time using a single display surface, such as a window, pane, region, etc. Moreover, the user can view CHDS for the registers along with program code containing variables stored in the registers.

Embodiments may be configured to support workflows employed by users working with registers. For example, embodiments may allow a user to execute code using floating point computations. The user may use a CHDS tool to operate as a fixed point lens with respect to the floating point data. This lens may allow the user to determine whether a register of a certain length will satisfy a design requirement without actually affecting the floating point data. When the user determines that a given register size will satisfy a design requirement, the user may modify floating point code to operate with fixed point registers. The user may execute the fixed point code and may evaluate performance of the code using the CHDS tool.

Embodiments may further be configured to allow the user to manipulate characteristics of registers as a simulation progresses. For example, an embodiment may allow a user to move a radix point in a register, change the size of a register, cause registers to auto scale, etc., while a simulation is running. Embodiments may allow the user to manipulate CHDS related display characteristics without affecting the underlying data being produced by executing program code. Embodiments may further allow a user to obtain detailed information about bins in a register by, for example, mousing over a bin. In this embodiment, a pop-up window, balloon, etc., may be displayed and may contain detailed information about the bin.

Exemplary embodiments may support other aspects of user workflows, such as code generation, code verification and/or validation, code deployment, system testing, etc.

Exemplary System

FIG. 1 illustrates an exemplary system 100 for practicing an embodiment. For example, system 100 may be used to design, simulate, test, and/or deploy systems having one more storage mechanisms. System 100 may include computer 110, input device 125, network 140, and target environment 130. The system in FIG. 1 is illustrative and other embodiments of system 100 can include fewer devices, more devices, and/or devices in configurations that differ from the configuration of FIG. 1.

Computer 110 may include a device that performs processing operations, display operations, communication operations, etc. For example, computer 110 may include logic, such as one or more processing or storage devices, that can be used to perform and/or support processing activities on behalf of a user. Embodiments of computer 110 may include a desktop computer, a laptop computer, a client, a server, a mainframe, a personal digital assistant (PDA), a web-enabled cellular telephone, a smart phone, smart sensor/actuator, or another computation or communication device that executes instructions for performing one or more activities and/or to generate one or more results.

Computer 110 may further perform communication operations by sending data to or receiving data from another device, such as a server (not shown in FIG. 1). Data may refer to any type of machine-readable information having substantially any format that may be adapted for use in one or more networks and/or with one or more devices. Data may include digital information or analog information. Data may further be packetized and/or non-packetized.

An embodiment of computer 110 may include simulation environment 120 and operating system 115. Simulation environment 120 may provide a computing environment that allows users to perform simulation or modeling tasks related to disciplines, such as, but not limited to, mathematics, science, engineering, medicine, business, etc. Simulation environment 120 may support one or more applications that execute instructions to allow a user to construct a model having executable semantics. In an embodiment, simulation environment 120 may execute the model to produce a result.

Models used with exemplary embodiments of the invention may include information in a textual or graphical form. For example, a model may be a textual model or graphical model that can be a time-based model (e.g., differential equation models, difference equation models, discrete-time models, or continuous-time models with or without algebraic constraints, etc.), event-based model, state transition model, data flow model, component diagram, entity flow diagram, equation-based language diagram, etc.

In an embodiment, simulation environment 120 can include a component, such as a software module, that provides capabilities for displaying CHDS representations for registers associated with a system being simulated. The CHDS component can provide capabilities for displaying information about registers, for allowing a user to interactively manipulate characteristics of registers, for allowing computer 110 to programmatically scale registers on behalf of a user, etc.

Operating system 115 may manage hardware and/or software resources associated with computer 110. For example, operating system 115 may manage tasks associated with receiving user inputs, operating computer 110, allocating memory, prioritizing system requests, etc. In an embodiment, operating system 115 may be a virtual operating system. Embodiments of operating system 115 may include Linux, Mac OS, Microsoft Windows, Solaris, UNIX, etc. Operating system 115 may further run on a virtual machine, which can be provided by computer 110.

Computer 110 can further include one or more display devices for displaying information to a user. In an embodiment, the display may include a cathode ray tube (CRT), plasma display device, light emitting diode (LED) display device, liquid crystal display (LCD) device, etc. Embodiments of the display may be configured to receive user inputs (e.g., via a touch sensitive screen) when desired. In an embodiment, the display can provide one or more graphical user interfaces (GUIs) to a user. The GUIs may display a model, inputs for a model (e.g., user specified objectives, constraints, display characteristics, etc.), model outputs, graphical representations of registers, representations for data associated with a bin of a register, and/or other types of information to a user.

Input device 125 may include logic to receive input from a user. For example, input device 125 may transform a user motion or action into a signal or message that can be interpreted by computer 110. Input device 125 can include, but is not limited to, keyboards, pointing devices, biometric devices, accelerometers, microphones, cameras, haptic devices, etc.

Network 140 may include any network capable of transferring data (e.g., packet data or non-packet data). Implementations of network 140 may include local area networks (LANs), metropolitan area networks (MANs) and/or wide area networks (WANs), such as the Internet, that may operate using substantially any network protocol, such as Internet protocol (IP), asynchronous transfer mode (ATM), synchronous optical network (SONET), user datagram protocol (UDP), IEEE 802.10, etc.

Network 140 may include network devices, such as routers, switches, firewalls, and/or servers (not shown). Network 140 may be a hardwired network using wired conductors and/or optical fibers and/or may be a wireless network using free-space optical, radio frequency (RF), and/or acoustic transmission paths. In an implementation, network 140 may be a substantially open public network, such as the Internet. In another implementation, network 140 may be a more restricted network, such as a corporate virtual network. Implementations of networks and/or devices operating on networks described herein are not limited to any particular data type, protocol, architecture/configuration, etc. For example, in an embodiment, network 140 may be a quantum network that uses quantum-compatible networking protocols.

Target environment 130 may include logic that executes instructions to perform one or more operations. In an embodiment, target environment 130 can include registers for storing information and processing logic adapted to execute code generated from one or more models. In an embodiment, target environment 130 can include real-time logic for performing processing operations in real-time. For example, target environment 130 may include a real-time operating system and hardware that are configured to process received signals or events in real-time or to execute simulations in real-time.

Exemplary embodiments of target environment 130 can include field programmable gate arrays (FPGAs), application specific integrated circuits (ASICs), application specific instruction-set processors (ASIPs), digital signal processors (DSPs), graphics processor units (GPUs), programmable logic devices (PLDs), etc. Target environments 130 can further include a single processor that includes two or more types of logic, such as cores. Target environments 130 can be configured to support multi-threaded or multi-process applications using FPGAs, ASICs, ASIPs, DSPs, GPUs, PLDs, cores, etc.

Exemplary Compact Histogram Density Scale

FIG. 2A illustrates an exemplary graphical representation for a register 200. Register 200 can include histogram density information within regions of a register representation, which in FIG. 2A is made up of square regions arranged side-by-side. For example, a register may be divided into bins where each bin represents a bit for the register. By way of example, representation 200 may depict a fixed point register having an integer region consisting of four bits as depicted by element 222. The integer portion may store values that are whole number and that reside to the left of a radix point 208 (also referred to as decimal point 208). Register 200 may include a most significant bin (MSB) 204 based on power of two scaling and least significant bin (LSB) 216. MSB 204 may be a leftmost bin in FIG. 2A and LSB 216 may be a rightmost bin. FIG. 2A may also include an MSB identifier 202 and an LSB identifier 218.

Bins may include coloring or shading to represent overflow occurrences, and this coloring/shading may be referred to as overflow indicator. MSB 204 may further include a border, or other indicator, to indicate the signedness of the fixed point type for the bin. For example, a signed bit indicator may identify signedness in FIG. 2A using a border around a bin.

Register 200 may further be associated with a word length indicator 210 that indicates the word length of the fixed-point type in register 200. Word length indicator 210 may be a visual affordance in an embodiment of the invention. Register 200 may use display techniques to identify bin values that are within a determined range. For example, a bin may use a first color shade to indicate low counts of binned data and a second color shade that may be darker, or denser, than the first color shade to indicate high counts of binned data.

Embodiments may use an in-range indicator 212 to identify a number of binned values with respect to one or more thresholds. For example, a light color shade may indicate low counts of binned data and a darker shade of the color may indicate higher counts. In this embodiment, all shades of a color, e.g., blue, may indicate that binned data is in range. A second color, such as red, may indicate that binned data exceeds an upper threshold of the range, and a third color, such as yellow, may indicate that binned data is below a lower threshold of the range. In an embodiment, an overflow indicator and an underflow indicator may be used to identify overflows (e.g., red) and/or underflows (e.g., yellow), respectively.

Embodiments may include a continuity indicator 214 to indicate that a CHDS displayed to a user is longer than a distance allocated for displaying the CHDS. For example, ellipses or another type of indicator may be used to indicate that a left portion of a displayed CHDS is related to a right portion of a displayed CHDS even though the left and right portions may be separated by a distance.

Embodiments may further use fractional bins 220 that can include values that are fractional quantities that reside to the right of the radix point. Fractional bins 220 may be associated with a fractional bin indicator that can include a visual identifier, e.g., a horizontal line drawn with respect to a CHDS.

Embodiments may provide a user with information about various aspects of a CHDS, such as names for portions of the CHDS or for information displayed in the CHDS. For example, a user may select a help feature associated with a CHDS tool and may be presented with a legend as shown in FIG. 2B. The legend may provide the user with names, numerical identifiers and explanations about aspects of the CHDS tool. Embodiments of the legend may be interactive or may be static depending on a configuration of the tool.

Figure 2C:
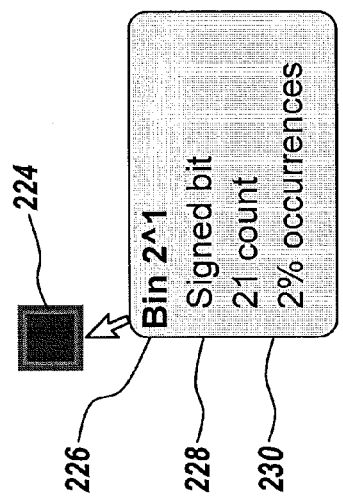
FIG. 2C illustrates an exemplary bin display feature that can be used with embodiments of the invention.

Referring to FIG. 2C, a user may interact with a histogram density bin 224 and a CHDS tool may provide the user with information about the bin. For example, a user may employ a pointing device, such as a mouse for interacting with aspects of a CHDS. When a cursor for the mouse passes over or hovers proximate to bin 224, the user may be presented with a window 225 that includes information about bin 224. For example, window 225 of FIG. 2C may include bin label 226 that can display information about bin 224 using power 2 scaling. Window 225 can further include signedness indicator 228 for identifying sign information for bin 224, and binned data 230 for presenting information about data in bin 224, such as but not limited to, count information (e.g., data) and occurrence information that can be displayed as a percentage of total occurrences for a CHDS.

FIG. 2D illustrates other interactive aspects of an exemplary CHDS. A user may hover proximate to an identifier for a radix point 223, such as a triangular icon, and may be presented with window 234 containing information related to the location of radix point 223. For example, a user may be presented with a word length size and a fraction length size. In an embodiment, the sizes can be provided in terms of bits.

Exemplary embodiments may include interactive bin selector 232 that can identify a word length line that allows the user to interactively change a word length for a displayed CHDS. The word length line may include an icon to the left of a radix point. For example, an embodiment can use an icon, or identifier, that is a dot or other shape. Embodiments can further include a fraction length resize 236 that can be used to determine a fraction length or to change a fraction length associated with a register displayed via a CHDS. An integer length resize 238 may allow a user to change an integer length for a register displayed via a CHDS. Selector 232 and resizers 236 and 238 can be visual affordances that can be manipulated by a user.

Figure 3A:
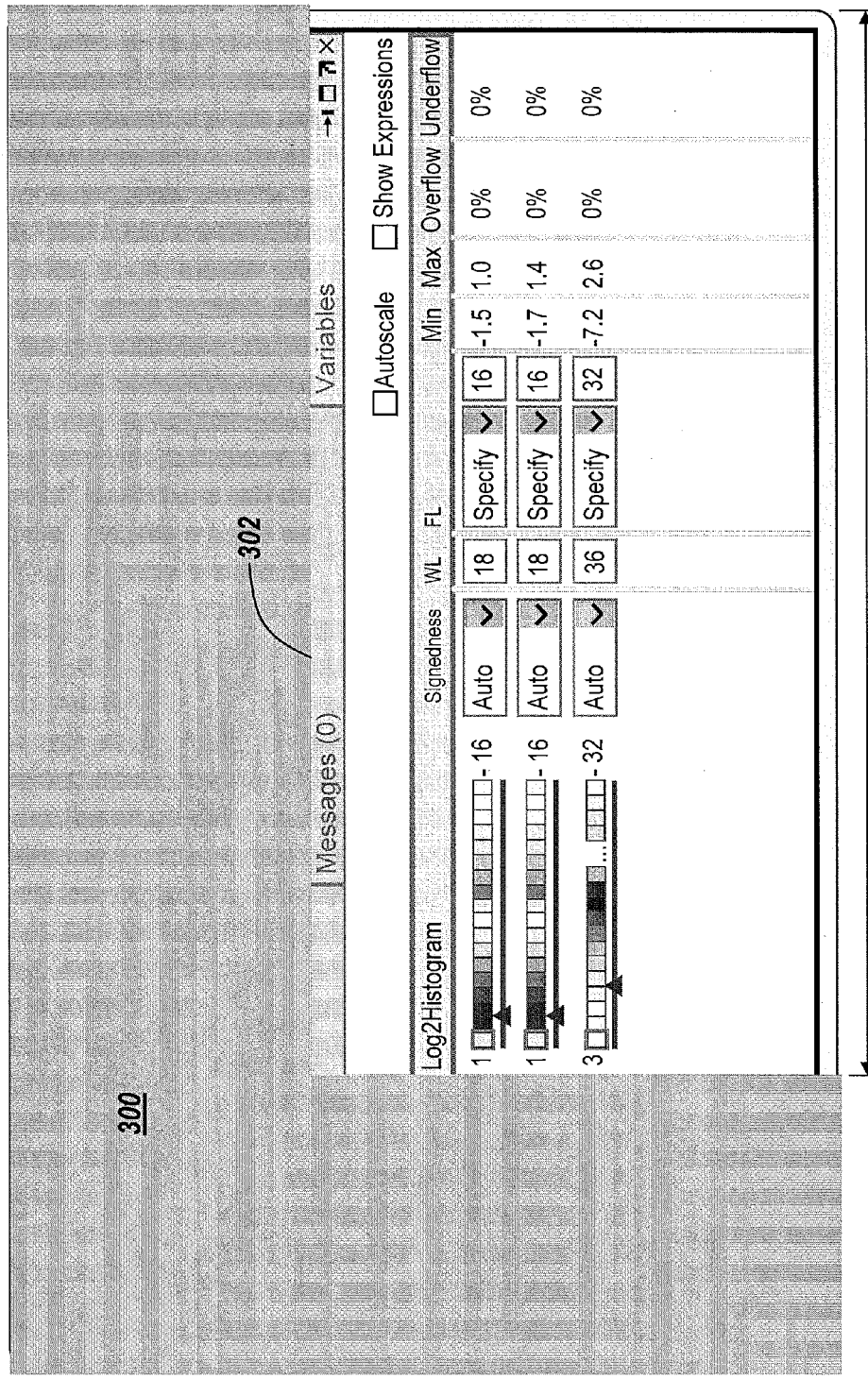
FIGS. 3A and 3B illustrate an exemplary implementation of a compact histogram density scale.

FIG. 3A illustrates an exemplary implementation of a CHDS. Display 300 may include an interactive CHDS region 302. Region 302 may include information related to registers that are written to or read from when code for a program is executed. Embodiments of CHDS tools can be used with simulation code or application code that runs, for example, in an embedded system containing registers.

Figure 3B:
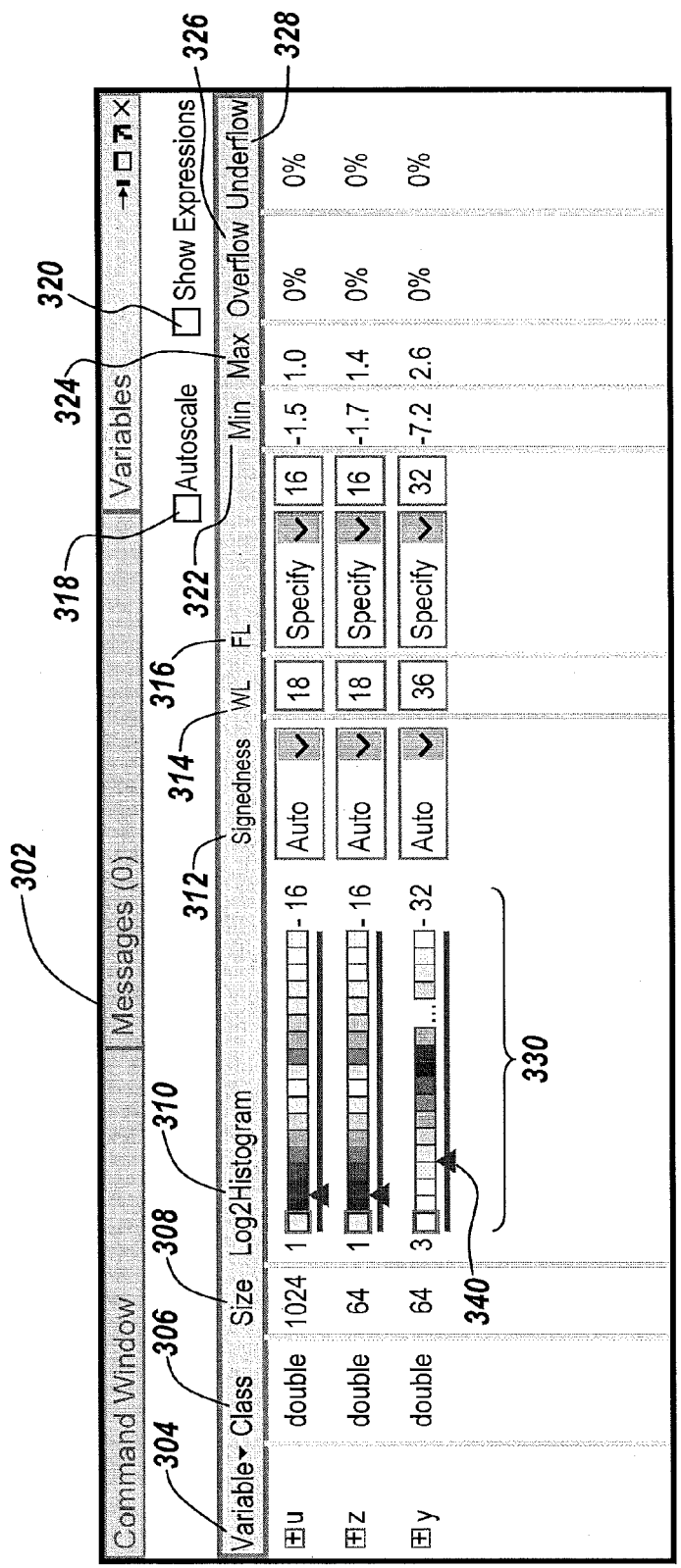

FIG. 3B illustrates region 302 of FIG. 3A in greater detail. Region 302 can include variable field 304 that can identify information about variables associated with registers displayed in region 302. For example, program code may include variables u, z, and y that are each associated with a register displayed in register field 310, also log 2histogram field in FIG. 3B. Region 302 may further include class field 306 that contains information about a class of a variable, such as double, single, etc. Size field 308 includes information about a size of a variable. Size information can be provided in number of elements, bytes, bits, etc.

Signedness field 312 includes information about the signedness of data associated with a register in region 302. Embodiments may allow signedness to be determined automatically, to be unsigned (i.e., not allowed to have negative values), etc. Word length field 314 may include information indicating a word length for a variable or register in region 302. Word length and fraction length field 316 may include information identifying a fraction length for a variable or register in region 302. Fraction lengths may be programmatically specified by computer 110 or may be specified by a user.

Minimum value field 322 may include information identifying a minimum value of data associated with a variable of region 302, and maximum value field 324 may include information identifying a maximum value of data for the variable. Overflow field 326 may include information indicating a number of overflows, and underflow field 328 may include information indicating a number of underflows for data observed with a register. In an embodiment, overflow and underflow information may be displayed as a percentage of a total count.

Region 302 may include options that can be selected by a user via a pointing device. For example, auto scale 318 may allow a user to specify that parameters associated with registers in region 302 should be auto scaled programmatically by computer 110. Show expressions 320 may show expressions associated with variables in region 302 when selected by a user.

Radix point 340 may include a symbol, shape, letter, or other type of identifier for indicating the location of a radix point for a register in region 302. Register region 330 may designate a portion of region 302 in which bins for a register, a MSB value, and an LSB value can be displayed.

Figure 4A:
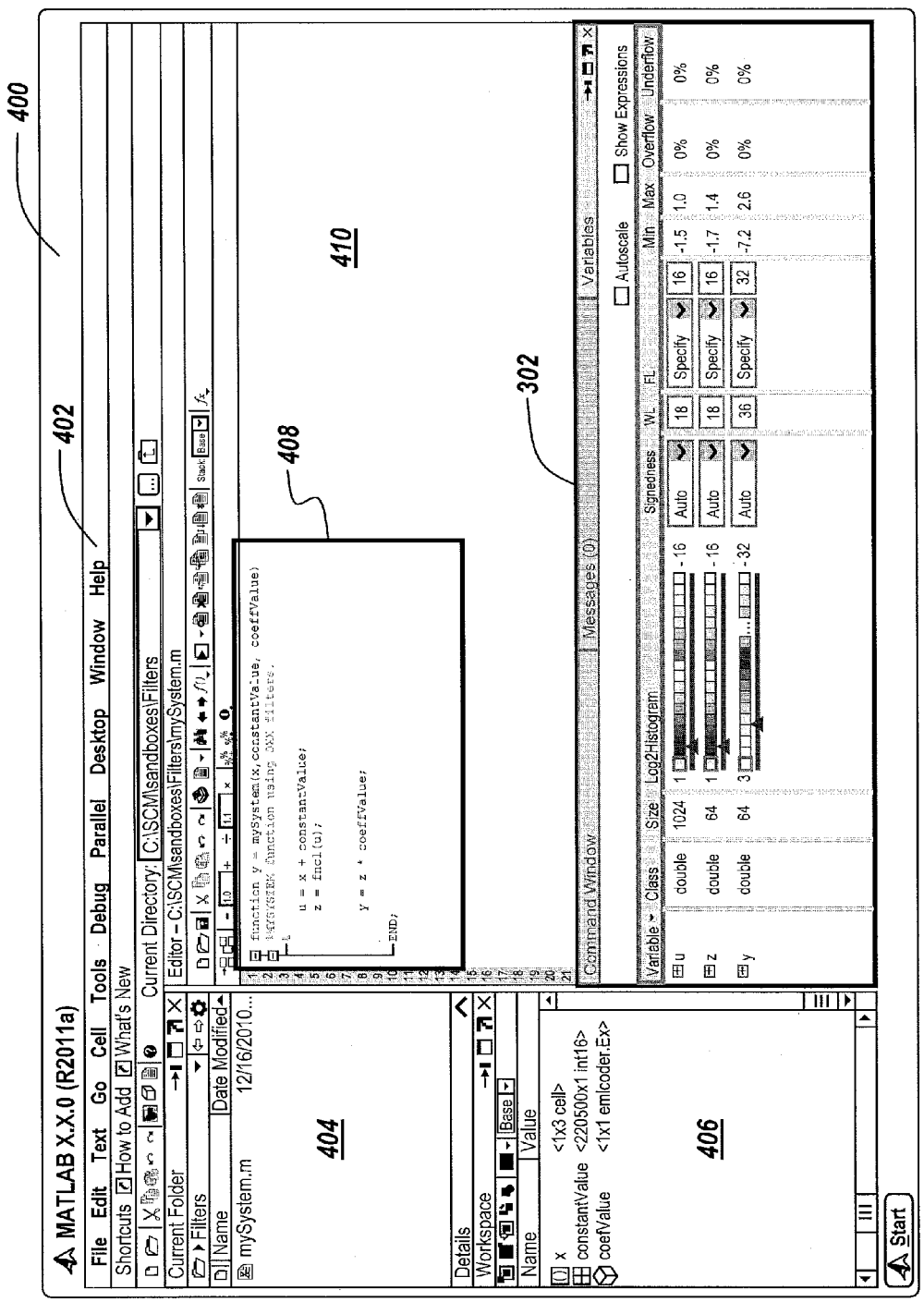

FIG. 4A illustrates an embodiment that can include a graphical user interface 400 for allowing a user to interact with code and/or registers. Interface 400 may include drop down menus 402 that allow a user to quickly access common functionality associated with interface 400. Drop down menus 402 may, for example, allow the user to create or save files; cut, copy or paste information into interface 400; debug or execute code; etc.

Interface 400 may further include directory region 404 that can occupy a portion of interface 400. Region 404 may include file system information, such as file names, folder names, file paths, directory paths, etc. Interface 400 can also include workspace region 406 that includes information about variables used in program code executed using interface 400. Region 406 can include variable names, size information for variables, and/or icons associated with variables.

Interface 400 can also include program region 410 for displaying program code to a user. Region 410 can allow a user to interact with displayed code and to perform operations on the code, such as running code, debugging code, annotating code, creating code, editing code, etc. For example, region 410 can include program code 408 that includes variables associated with information stored in registers illustrated in region 302 of interface 400.

FIG. 4B illustrates program code 408 in greater detail. For example, program code 408 includes variables u, z, and y that are respectively associated with registers in region 302 of FIG. 4C. In an embodiment, variable identifiers (e.g., names) in region 302 may appear in the order in which they occur in program code 408. For example, variable field 304 includes variables u, z, and y displayed in the order in which they appear in program code 408 of FIG. 4B. Code 408 may be configured to perform floating point or fixed point computations as determined by a user.

Figure 5A:
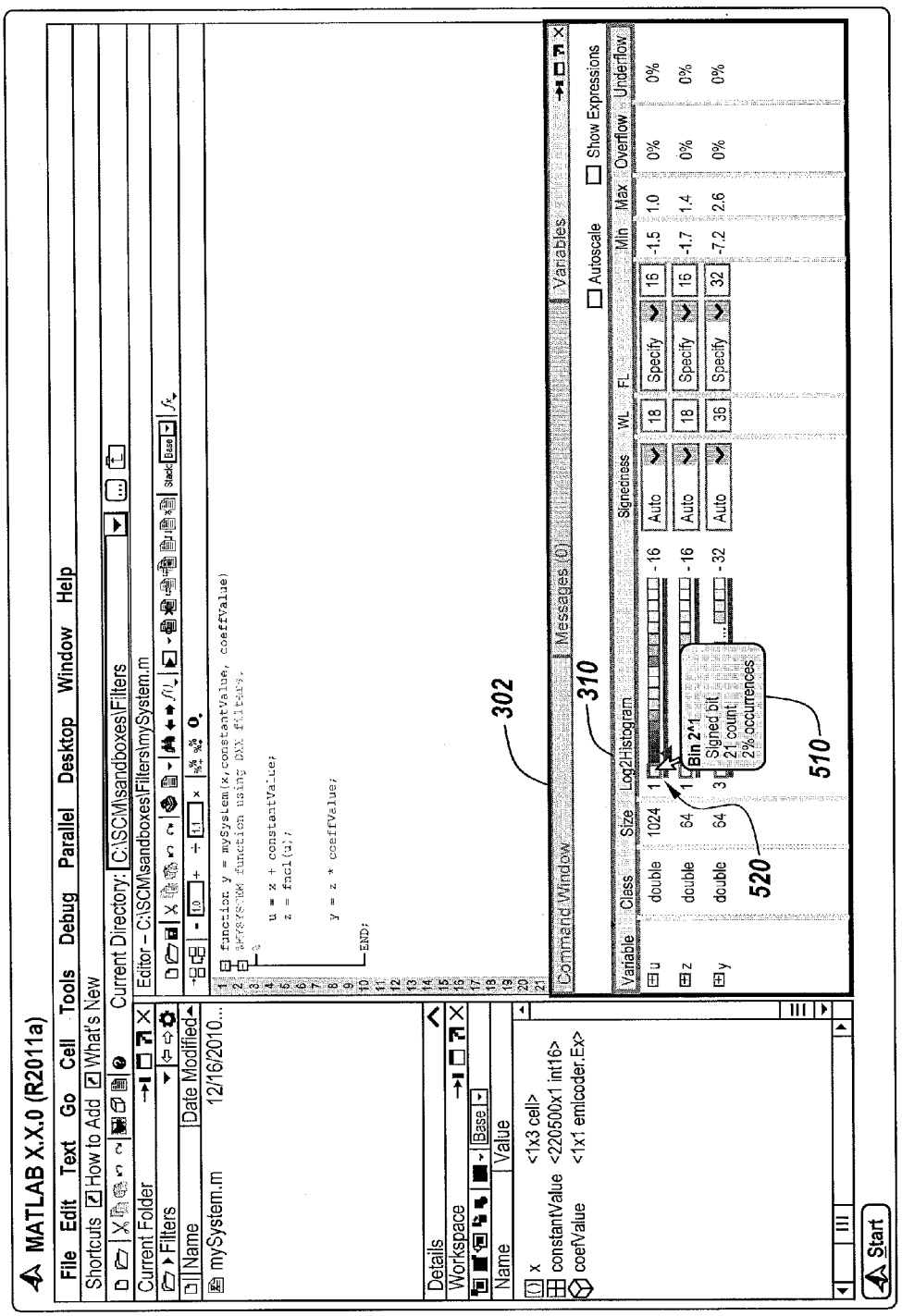
FIGS. 5A-7B illustrate an exemplary implementations for displaying bin count information for a compact histogram density scale.
Figure 5B:
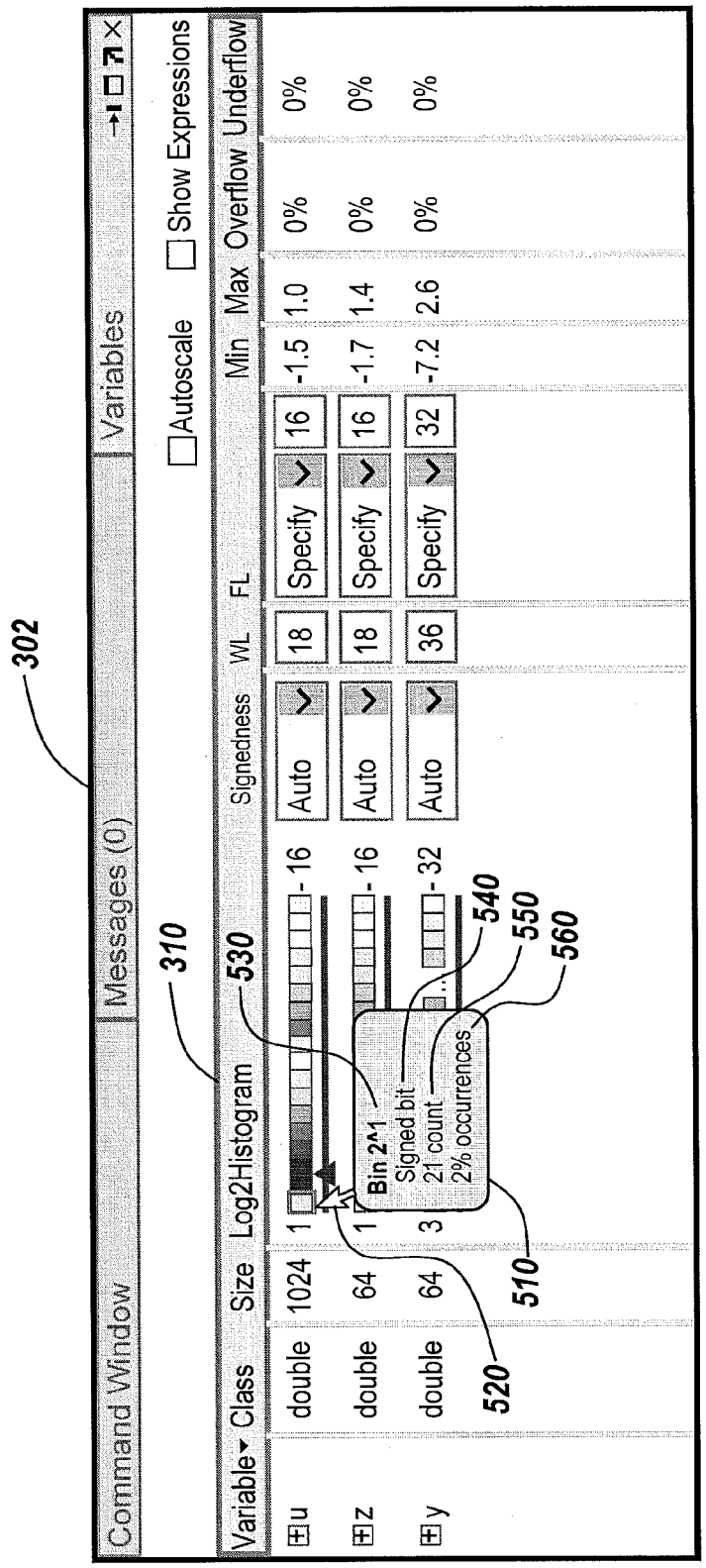

FIG. 5A illustrates an embodiment in which region 302 includes a bin label. FIG. 5B illustrates region 302 of FIG. 5A in greater detail. A user may move a cursor over a segment of a CHDS. Label window 510 may be displayed when cursor 520 is proximate to a bin of a register, e.g., a register storing data associated with variable u. Label window 510 may display information about a bin to the user. For example, label window 510 may display bin label information 530 identifying a particular bin for which displayed data is associated. Label window 510 may further display signed bit information 540, count information 550, and occurrence information 560.

Figure 6A:
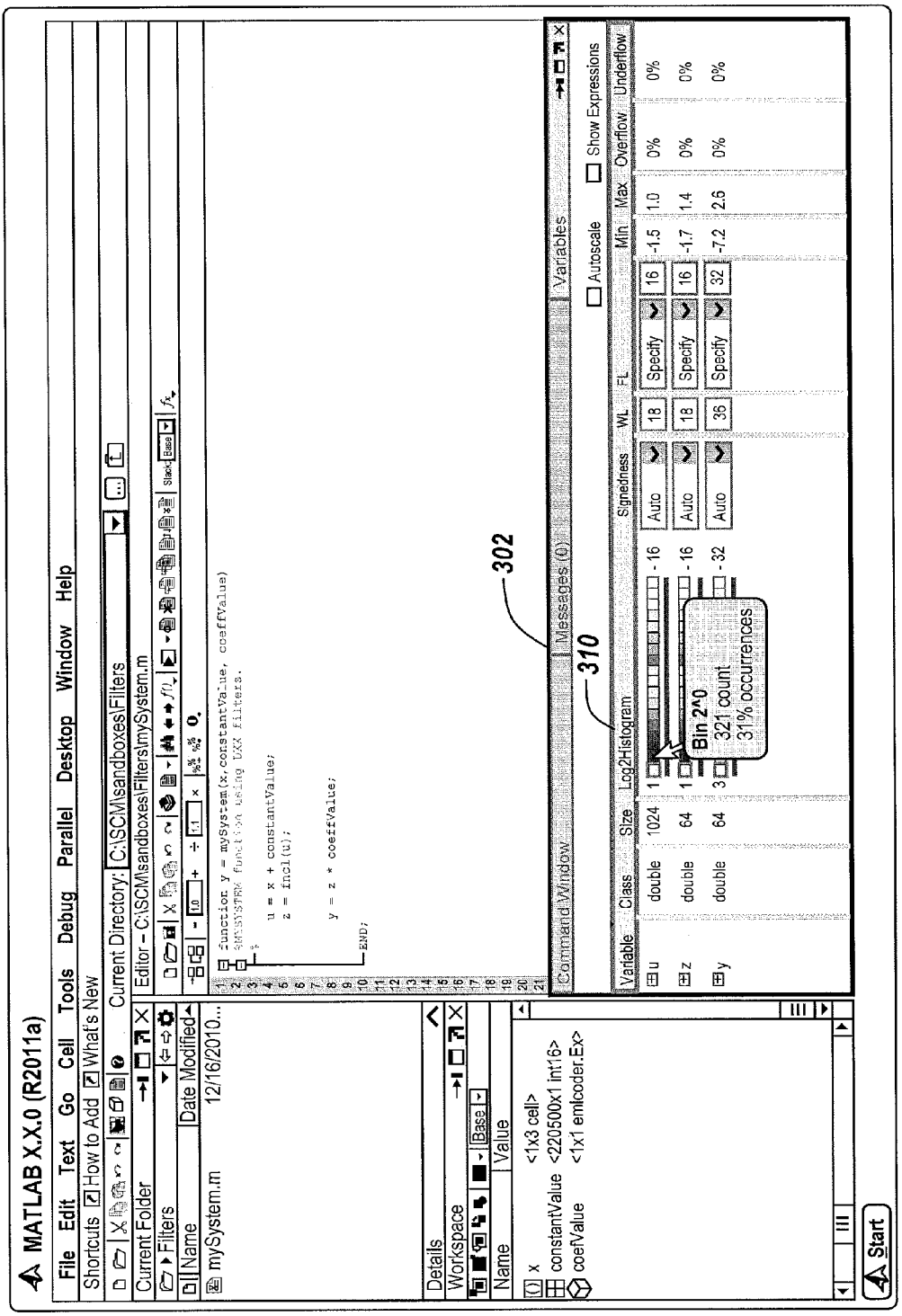
Figure 6B:
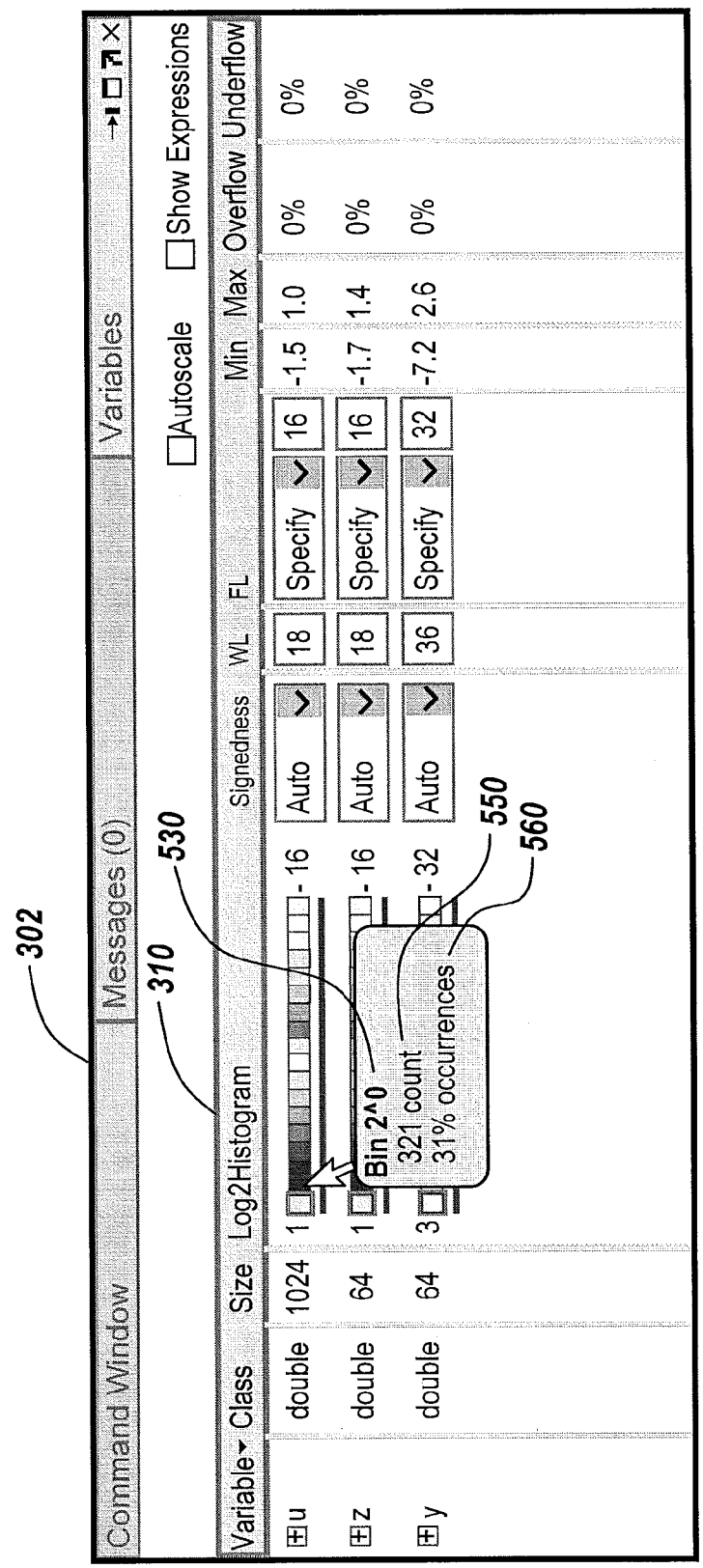

FIG. 6A illustrates an embodiment displaying a label window for a bin adjacent to the bin of FIGS. 5A and 5B. A user may move a cursor to the right of the $2^1$ bin so that the cursor is proximate to the $2^0$ bin. Referring to FIG. 6B, bin label information 530 may identify the $2^0$ bin, count information 550 may identify bin counts for the $2^0$ bin, and occurrence information 560 may identify information about bin counts as a percentage of, for example, total bin counts for a register.

Figure 7A:
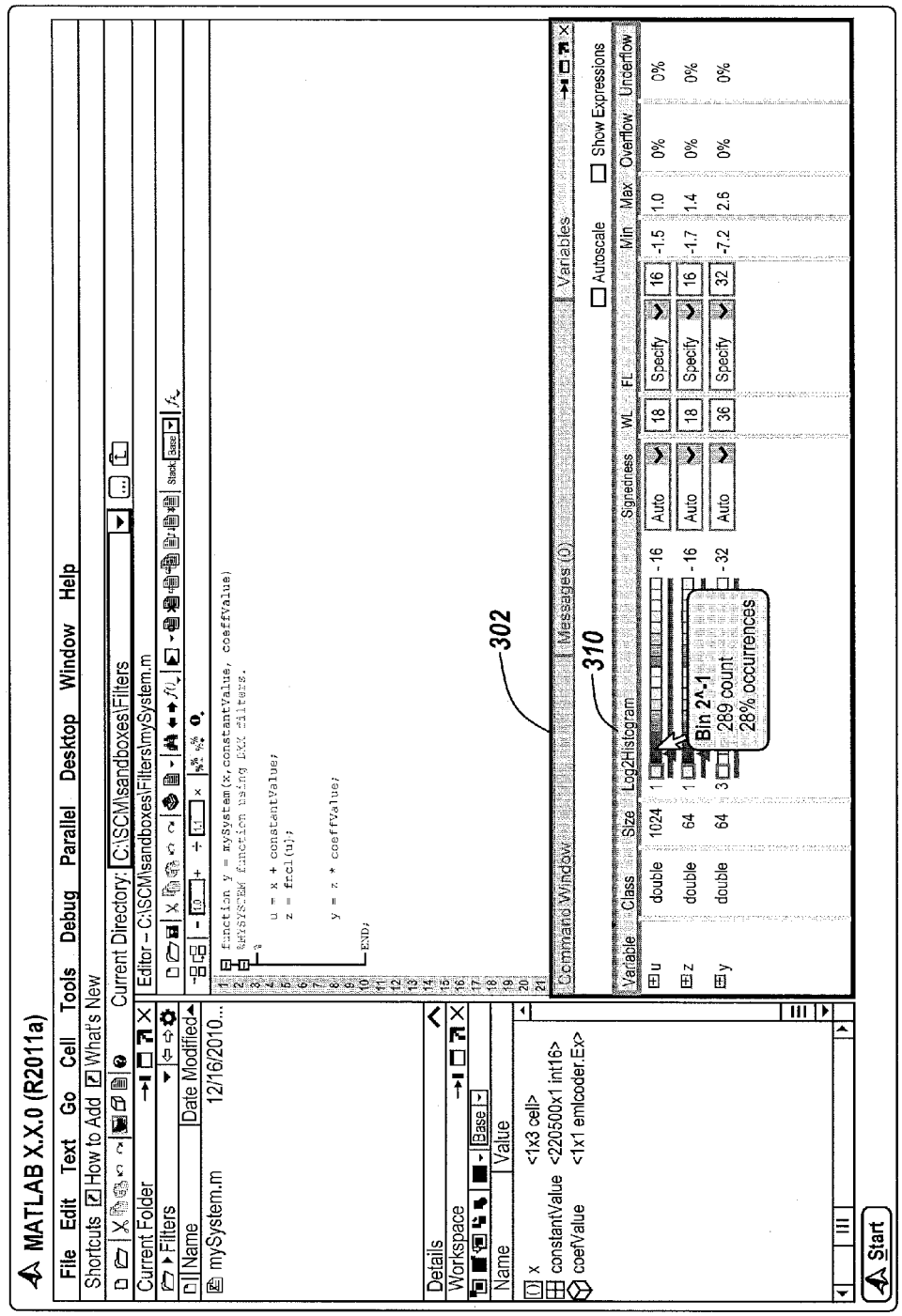
Figure 7B:
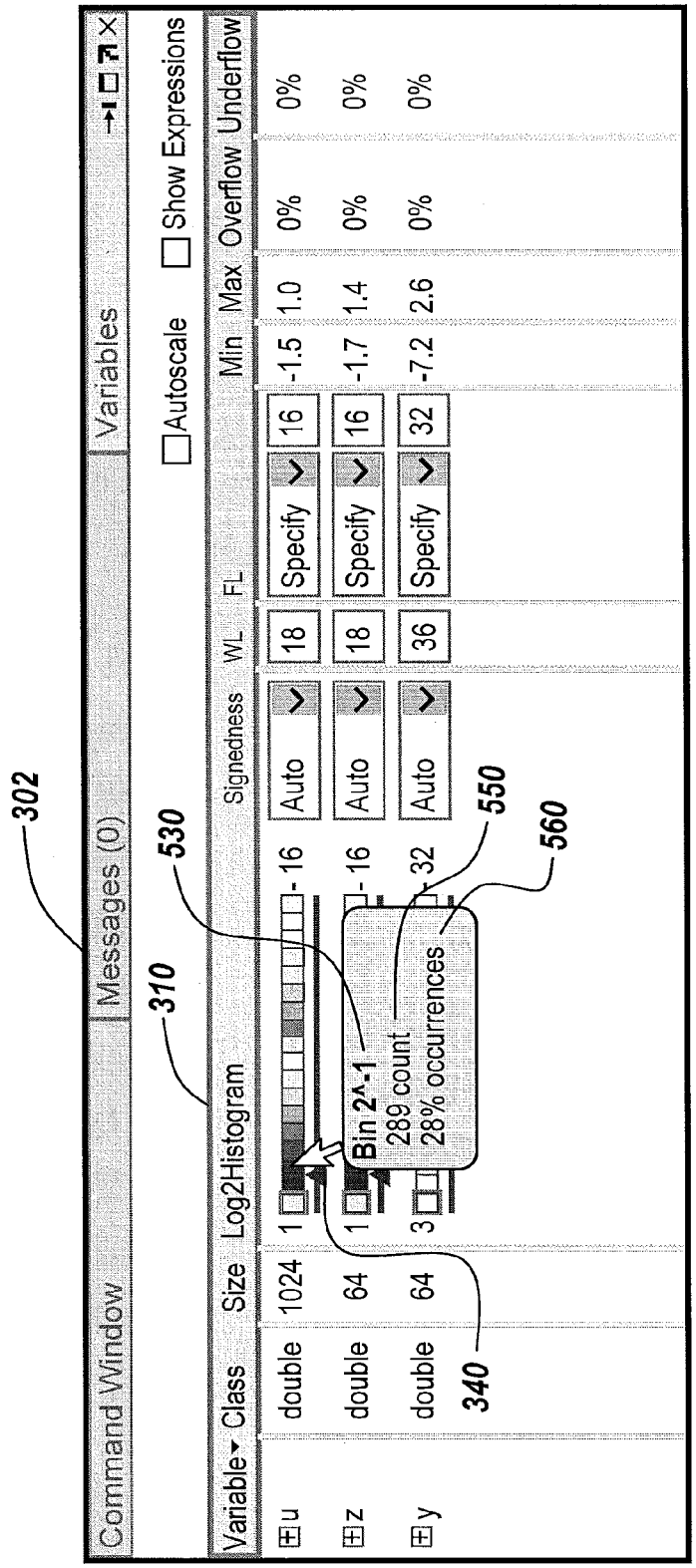

FIG. 7A illustrates an embodiment displaying a label window for a bin to the right of a radix point. FIG. 7B illustrates the contents of region 302 of FIG. 7A in greater detail. Referring to FIG. 7B, a user may move cursor 340 to the right with respect to the cursor position of FIG. 5B. Cursor 340 may be proximate to the $2^{-1}$ bin and label window 510 may display information for the $2^{-1}$ bin, such as bin label 530, count information 550, and occurrence information 560.

Figure 8A:
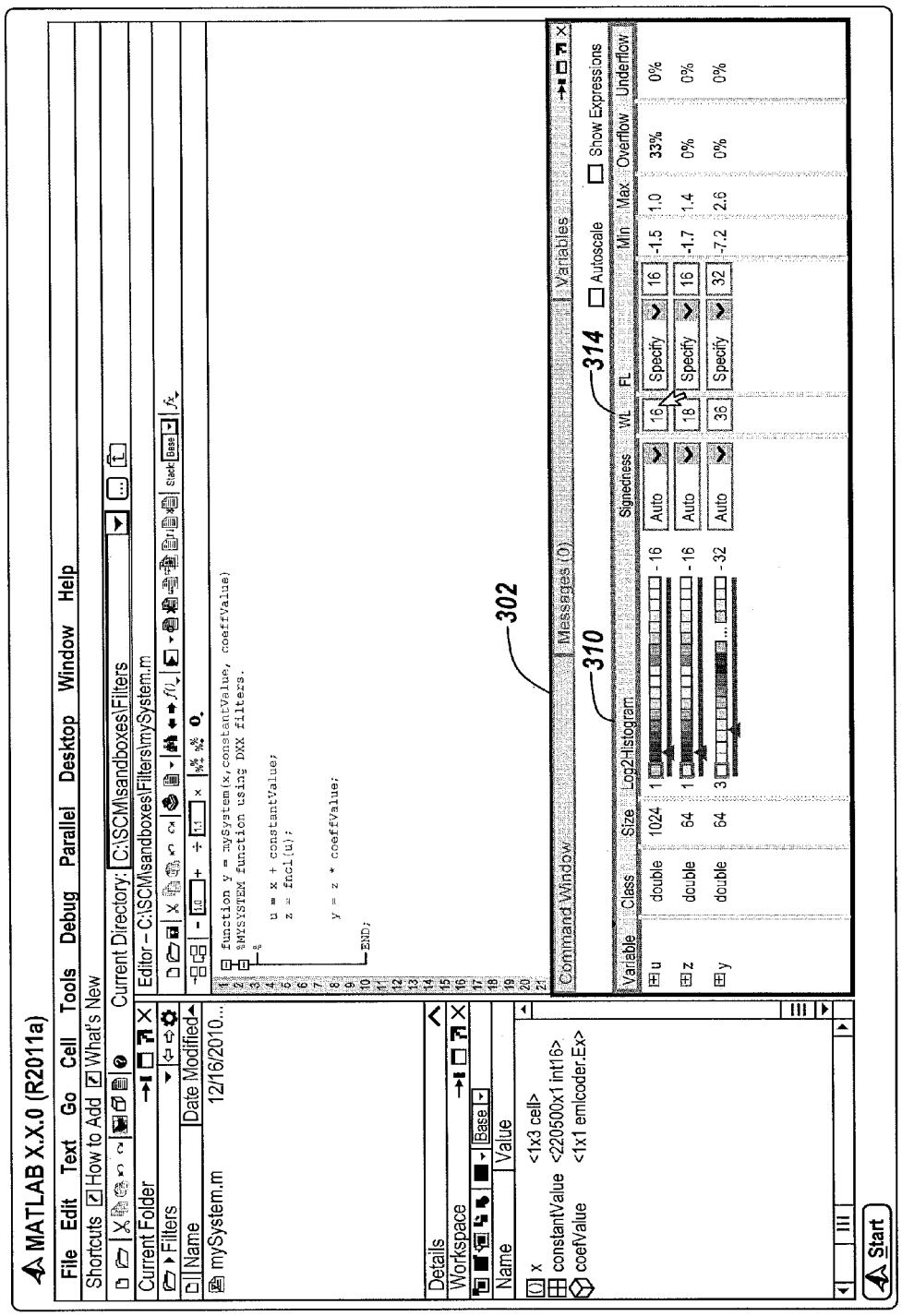
FIGS. 8A-8C illustrate an exemplary implementation for changing word length information associated with a compact histogram density scale.
Figure 8B:
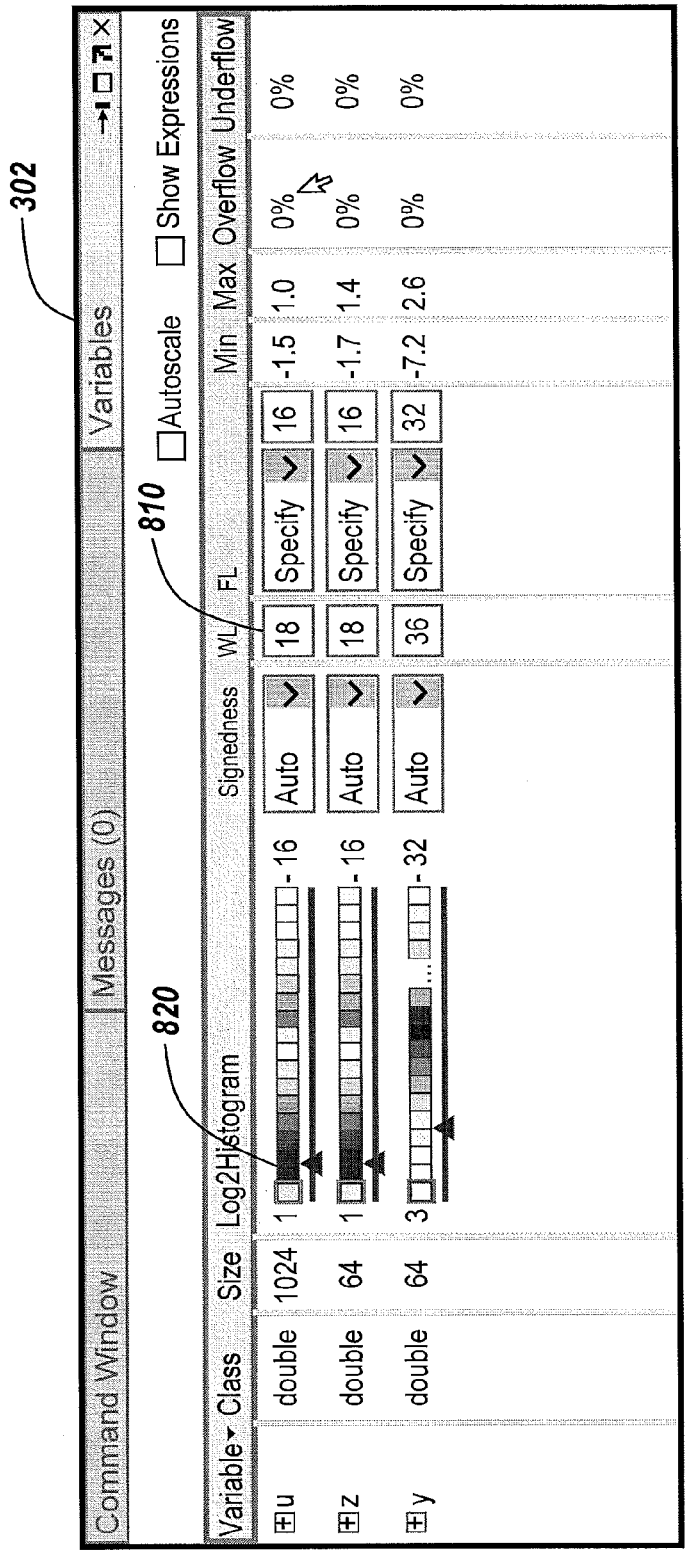

FIG. 8A illustrates an embodiment that allows for changing a word length of a register. FIG. 8A illustrates region 302 in an embodiment that allows a user to change a word length for one or more registers containing CHDS data. Referring to FIG. 8B, which shows region 302 of FIG. 8A in greater detail, a user may position a cursor proximate to word length identifier 810 for a register storing data for variable u. A bin, such as bin 820, for the register may include CHDS data of a first color or shade which may indicate that data for the bin is between a lower threshold defining underflows and an upper threshold defining overflows. An initial word length for register 820 may be 18 bits as shown in FIG. 8B.

Figure 8C:
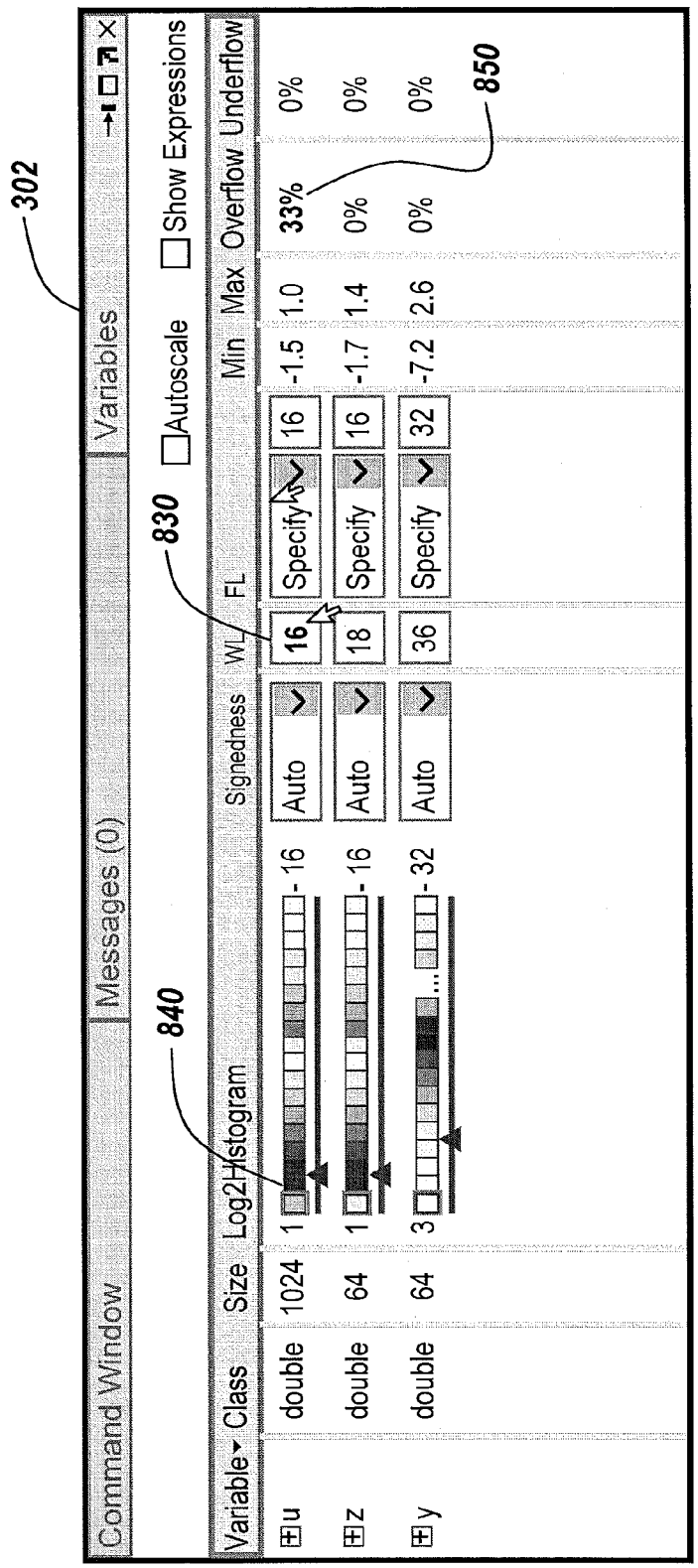

The user may select word length identifier 810 and may change the word length value to, for example, 16 bits as shown in FIG. 8C. Changing a word length for a register may cause statistics for the register to change. For example, overflows for the register of variable u may be 0% when the word length is 18 bits (FIG. 8B). However, the overflows may rise to, for example, 33% when the word length is changed to 16 bits as shown by element 850 of FIG. 8C.

A bin for the register, such as bin 840, may include CHDS data having a shade or color that differs from the shade or color of bin 820 in FIG. 8B. The shade or color of bin 840 may differ from that of bin 820 to indicate the presence of overflows when the word length for the register is 16 bits. Embodiments, such as the one shown in FIGS. 8A-8C, provide a user with real-time feedback with respect to the operation of registers when parameters associated with the registers are manipulated. Real-time as used herein can refer to response times that are sufficiently fast so as not to adversely affect a user's interactions with a tool, application, etc., and/or so as not to discourage the user from making use of interactive capabilities of the tool, application, etc.

Figure 9A:
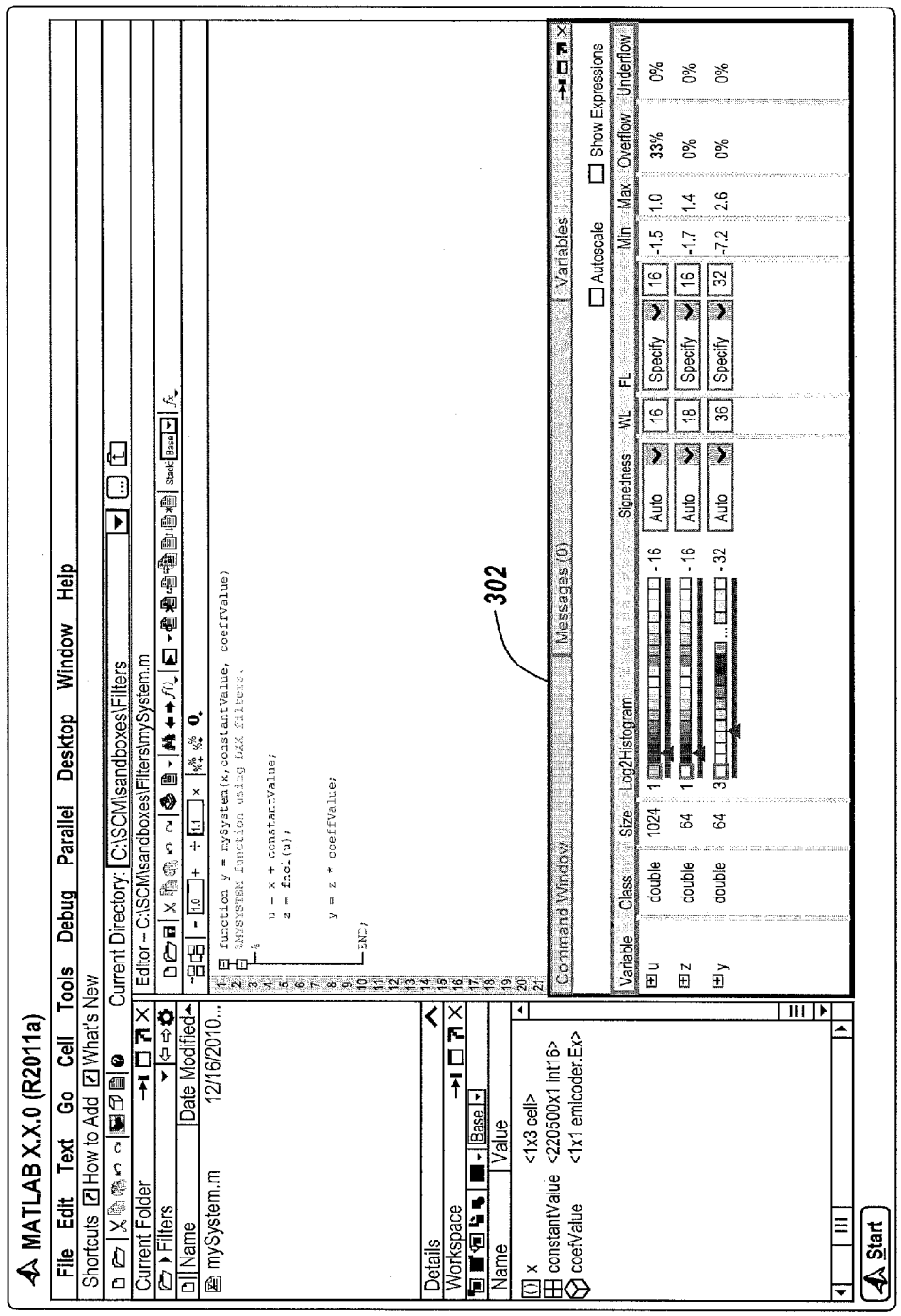
FIGS. 9A-9B illustrate an exemplary implementation for changing the signedness information associated with a compact histogram density scale.
Figure 9B:
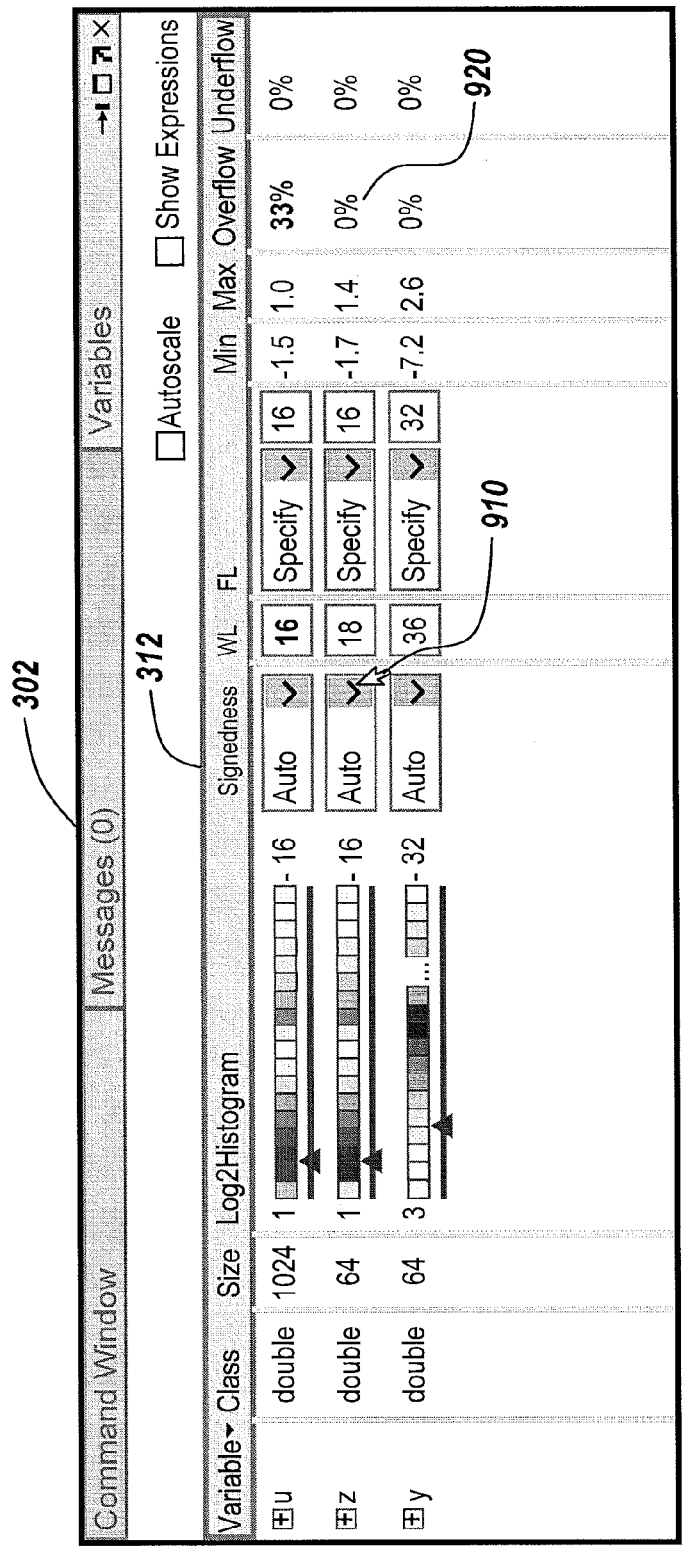

FIG. 9A illustrates an embodiment that allows for changing the signedness of a register. FIG. 9A illustrates an embodiment of region 302 that includes registers for which the signedness of CHDS data in the registers can be changed. FIG. 9B illustrates region 302 of FIG. 9A in greater detail. A user may place a cursor proximate to a signedness identifier 910 for a register displayed in region 302. The user may select identifier 910 and a drop down menu may be provided that offers the user valid selections for the register. For example, the user may select identifier 910 and may select "unsigned" and "unsigned" may be loaded into identifier 910 (FIG. 9C). When unsigned is specified, values for variable z may be unrepresentable and may further translate into overflows. In FIGS. 9A-9B, the overflows for the register of variable z may be 0% (element 920 in FIG. 9B); however, when unsigned is selected, overflows for the register may increase to 12%. Embodiments may allow a user to changed signedness for a register without affecting underlying data associated with executing program code.

Figure 10A:
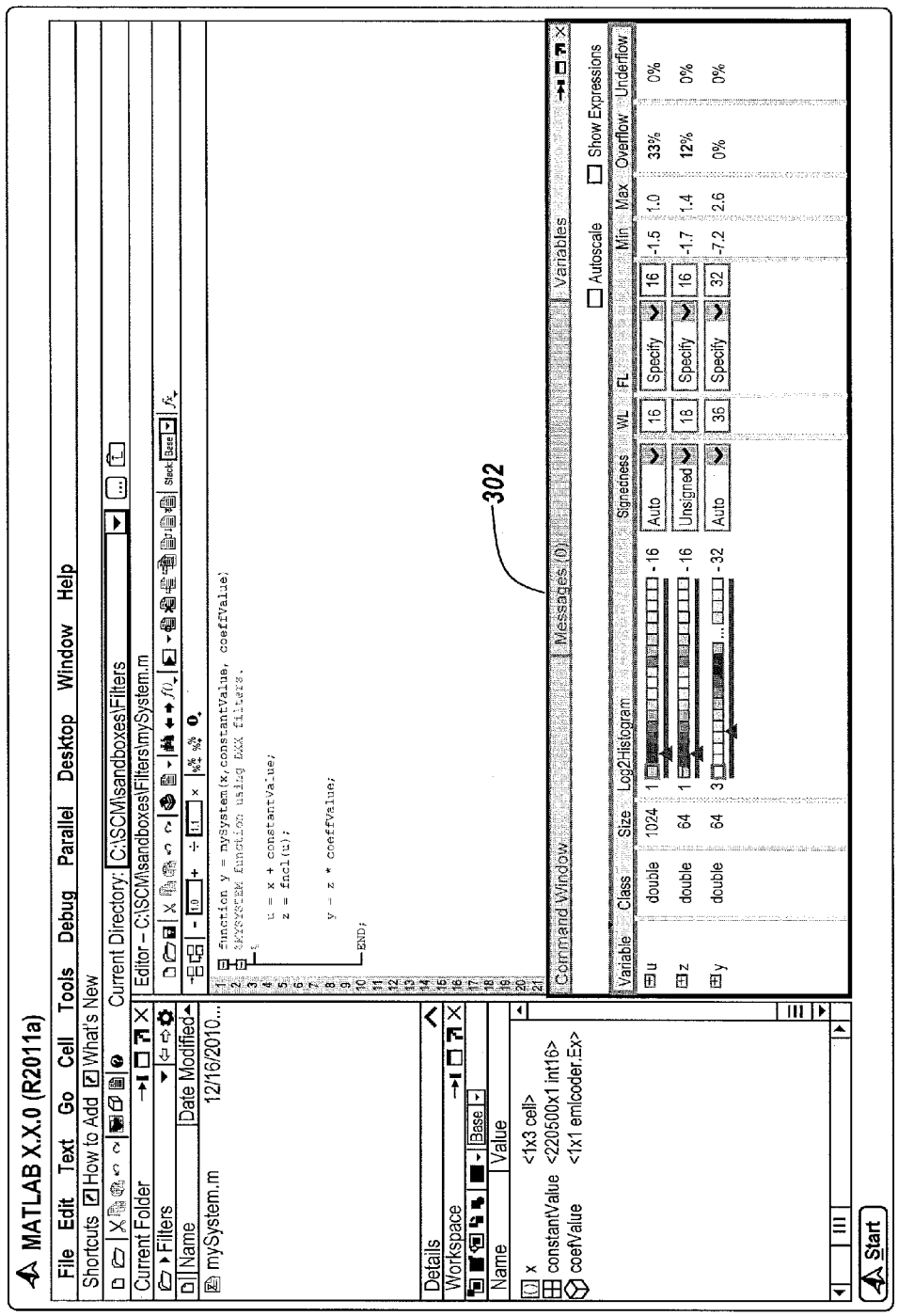
FIGS. 10A and 10B illustrate an exemplary implementation for splitting a display region of a compact histogram density scale.
Figure 10B:
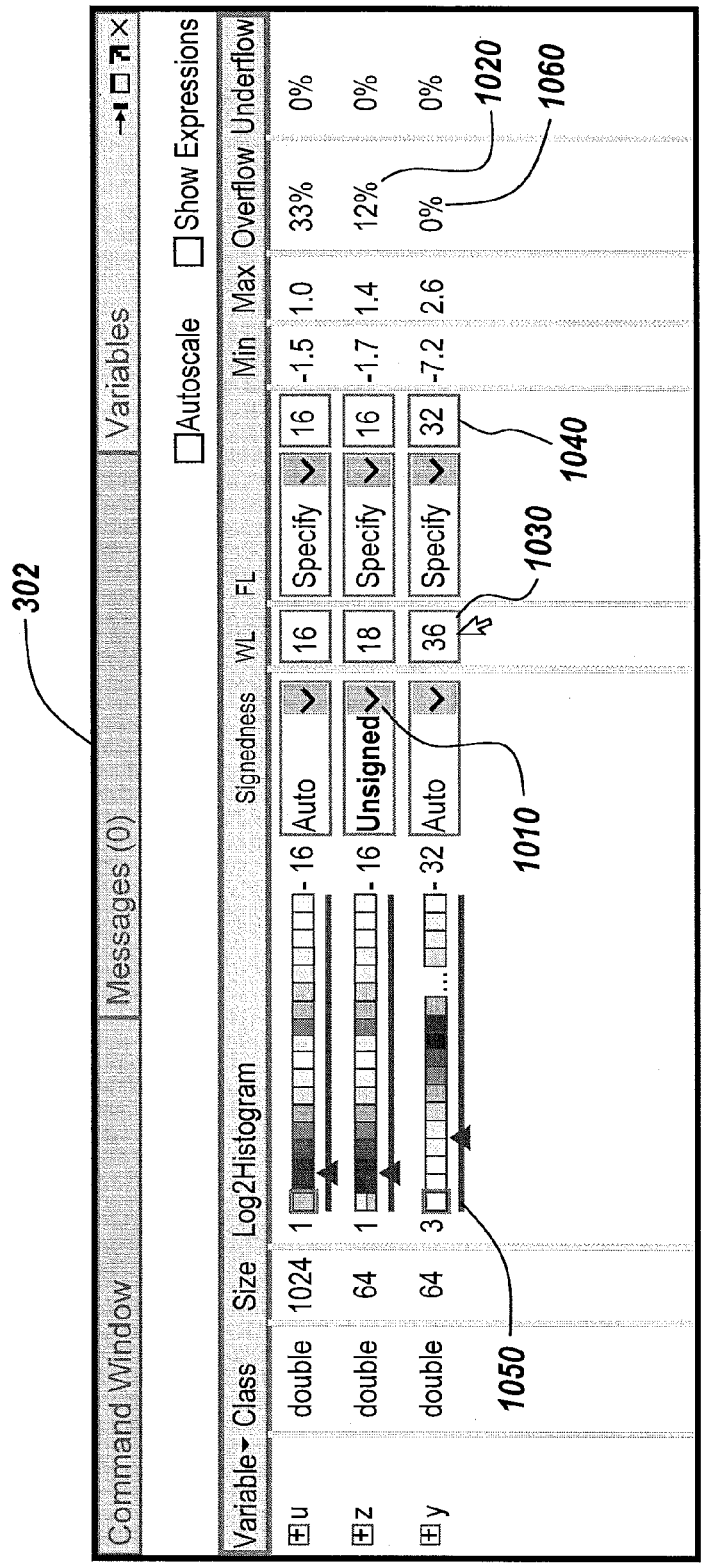

FIG. 10A illustrates an embodiment in which a register bin containing CHDS data can be partitioned into an upper portion and a lower portion. In some situations, a user may wish to detect overflows in a positive direction (e.g., greater than zero) and overflows in a negative direction (e.g., less than zero). FIG. 10B illustrates region 302 of FIG. 10A in greater detail. The CHDS of variable z may use the same colors and/or shading with unsigned values as was used when signedness field 312 was specified as "auto". In FIG. 10B, the lower regions for the $2^1$ and $2^0$ bins (i.e., the leftmost bins in FIG. 10B for the register of variable z) may include coloring/shading that indicates overflows in the negative direction (negative values). The overflows may further be reflected by the number 12% in overflow field 326.

The embodiment of FIG. 10B may further allow a user to change other parameters associated with registers displayed in region 302. For example, the user may be able to change a word length using an interactive bin selector 1050. In FIG. 10B a word length for variable y may be 36 bits as shown by identifier 1030 and a fraction length may be 32 bits as shown by identifier 1040. A word length of 36 bits and a fraction length of 32 bits may maintain an overflow percentage of 0% as shown by identifier 1060.

Figure 11A:
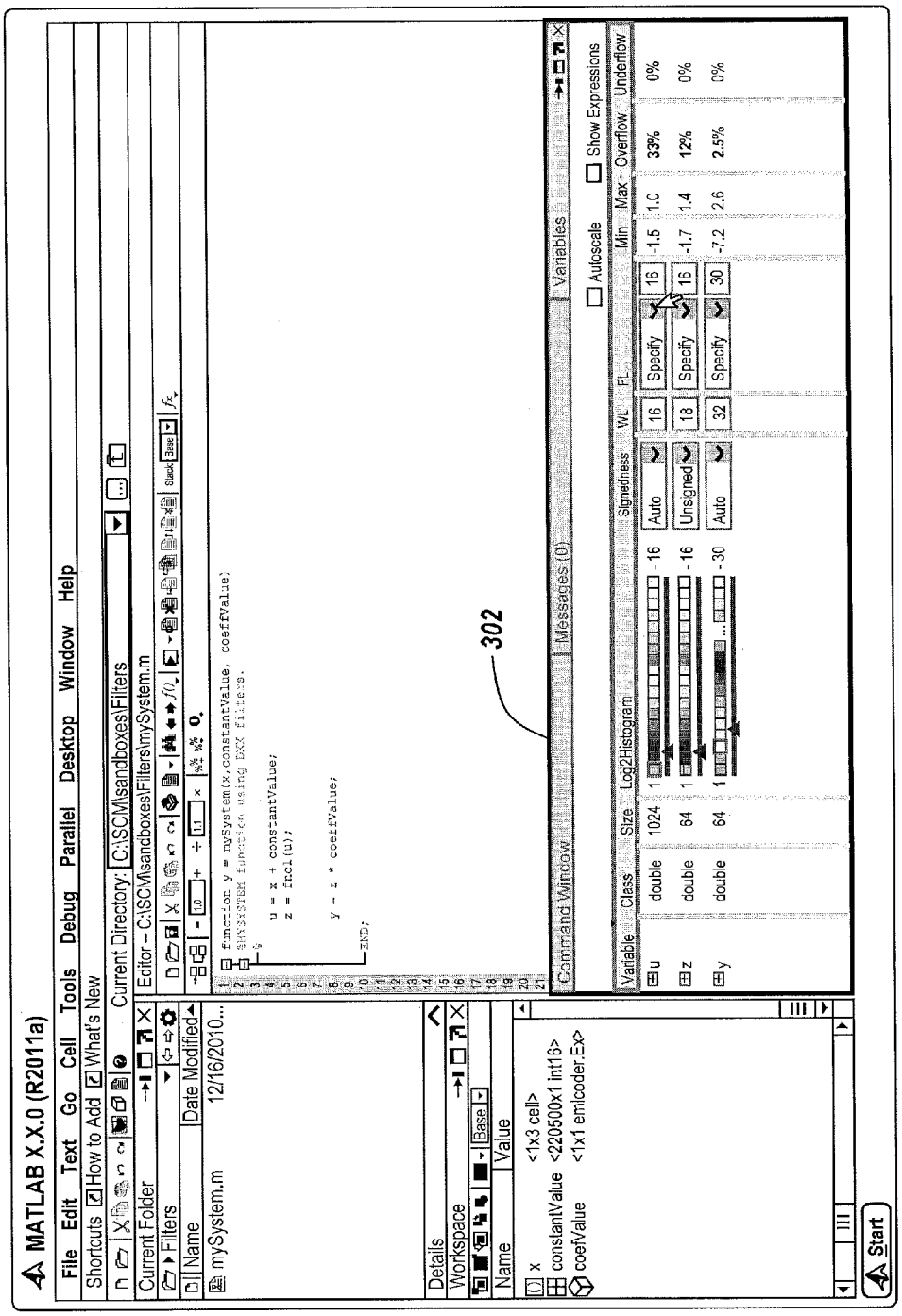
FIGS. 11A and 11B illustrate an exemplary implementation for changing a word length associated with a compact histogram density scale.
Figure 11B:
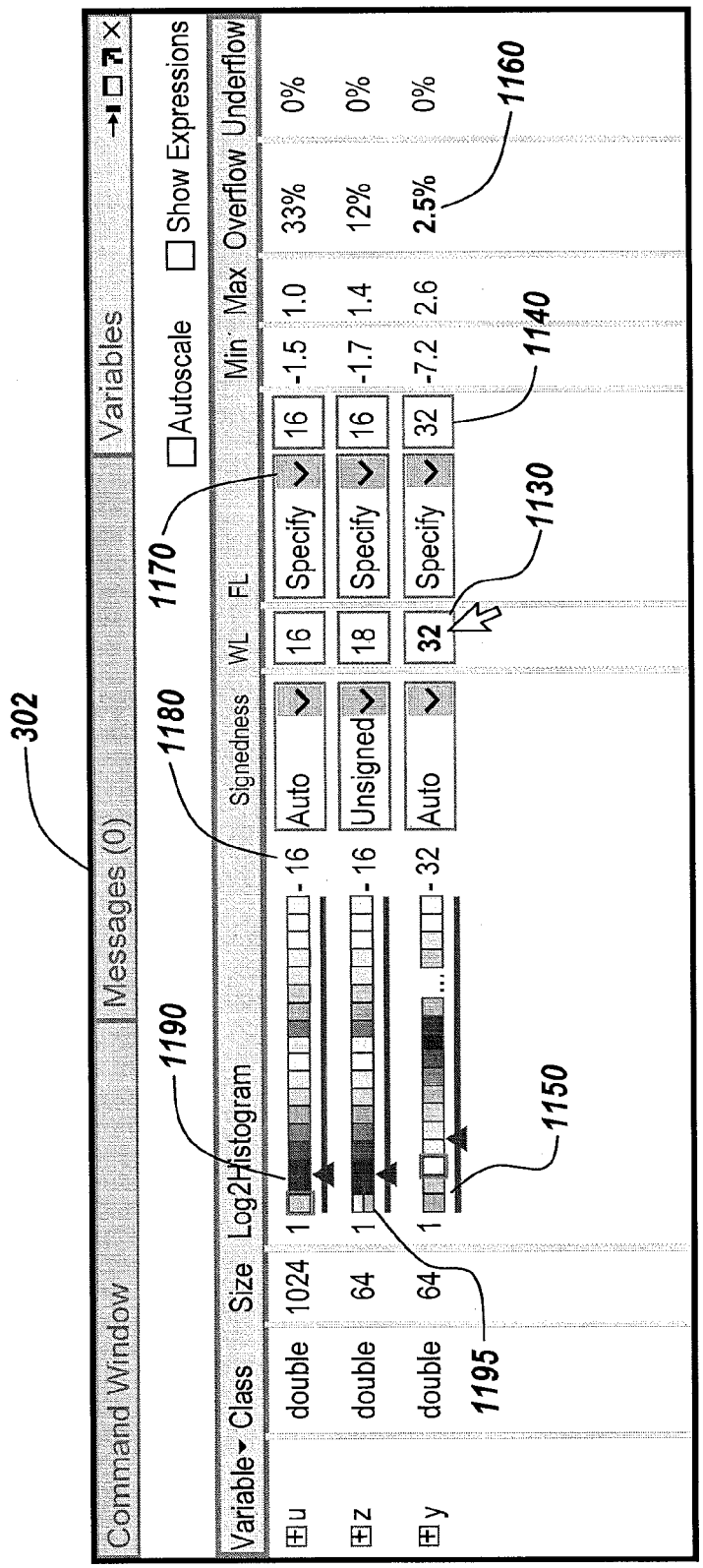

FIG. 11A illustrates an embodiment that allows a user to change a word length and fraction length for a register associated with a variable. FIG. 11B shows region 302 of FIG. 11A in greater detail. A bin, such as $2^0$, may indicate an overflow (element 1190) by showing a color, such as red. The overflow may occur when the fraction length is set to "specify" and 16 bits. Region 302 may include an identifier 1180 that indicates the length of a fractional part of the register, here 16 bits.

A cursor may be used to select and toggle fraction length identifier 1170 for variable u. For example, a user may change identifier 1170 from "specify" to "auto", where auto causes the fraction length to automatically scale so as to achieve a desired overflow or under flow rate. The embodiment of FIG. 11B may further allow a user to change a word length for a register associated with variable y from 36 bits (as shown in FIG. 10B) to 32 bits in FIG. 11B. The user may also change the fraction length for the register from 30 bits (as shown in FIG. 10B) to 32 bits as shown in FIG. 11B via identifier 1140. Changing the word length from 36 bits to 32 bits for variable y may cause an overflow value to go from 0% (FIG. 10B) to 2.5% (FIG. 11B) as indicated by identifier 1160.

Figure 12A:
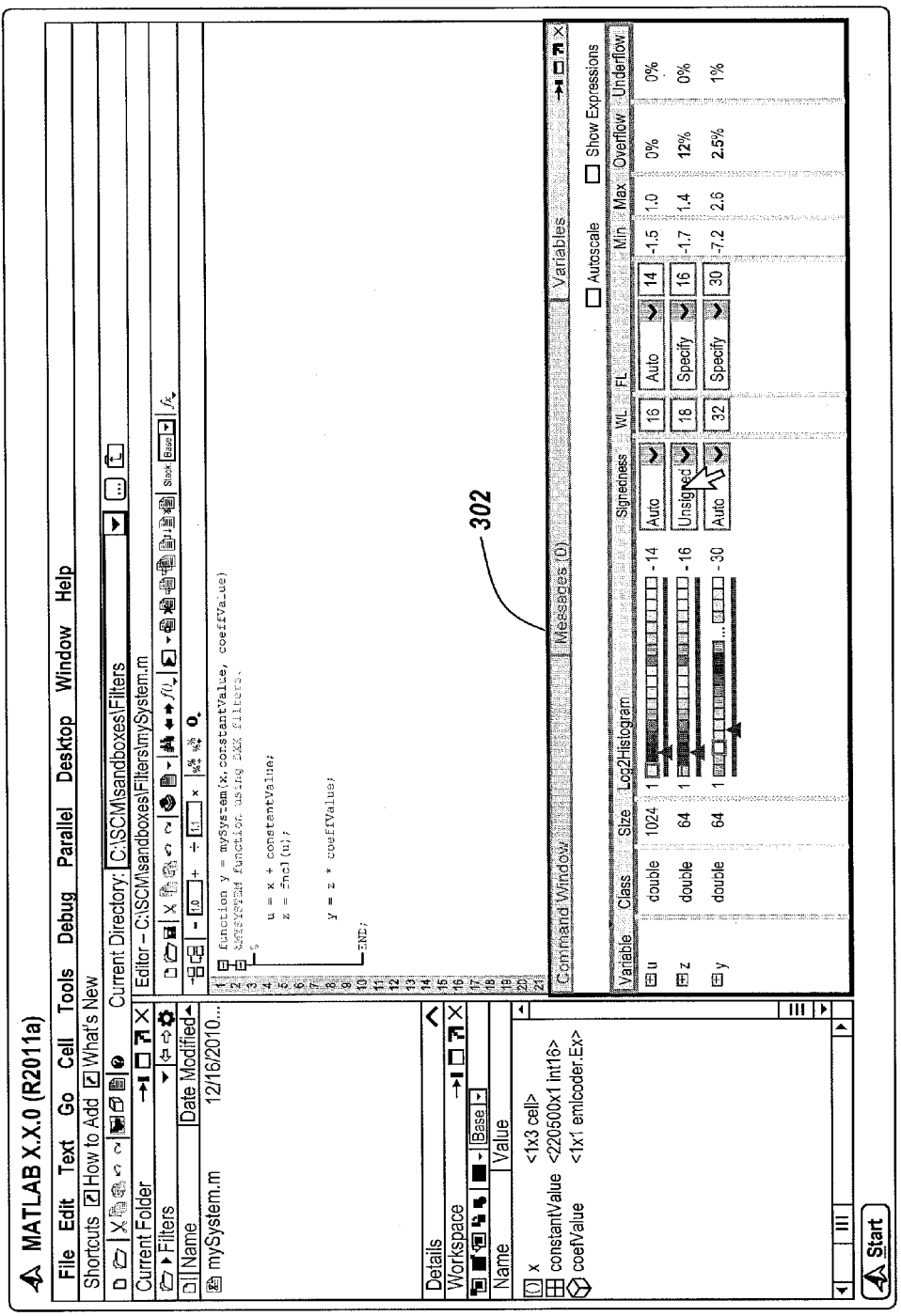
FIGS. 12A and 12B illustrate an exemplary implementation for changing a fraction length from a user specified value to an automatically determined value, where the parameter is associated with compact histogram density scale.
Figure 12B:
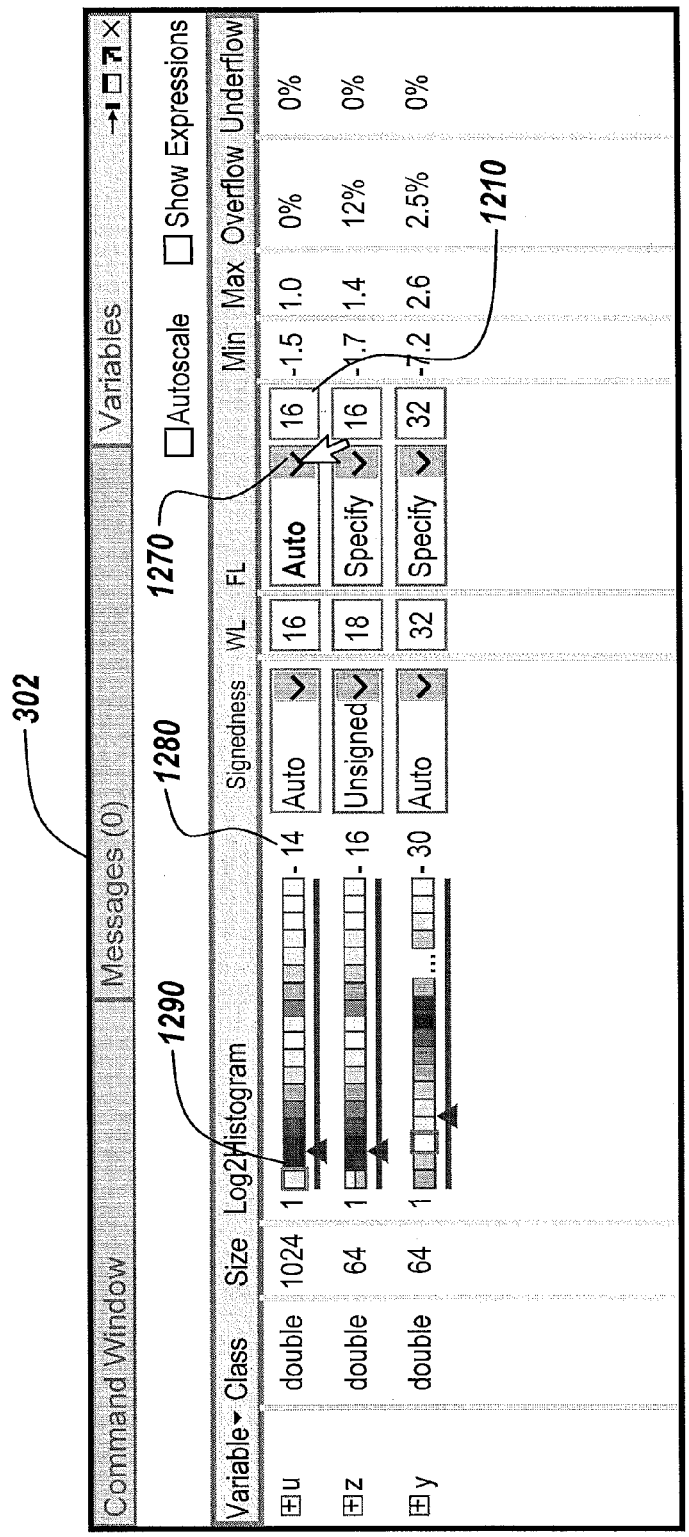

FIG. 12A illustrates an embodiment that allows for changing a fraction length parameter from a user specified value to an auto-scaled value. FIG. 12B illustrates region 302 of FIG. 12A in greater detail. In FIG. 12B, a user may toggle identifier 1270 from "specify" to "auto". For example, a user may have specified that the fraction length be 16 bits (FIG. 11B) for variable u. The user may decide to allow a system to auto-scale the fraction length for the register storing data for variable u and may change identifier 1270 from "specify" to "auto" using a pointing device.

When auto is specified, a fraction length value 1210 may change from 16 (FIG. 11B) to 14 (FIG. 12B). The new value of the fraction length may also be displayed proximate to register bins as shown by identifier 1280. Decreasing the fraction length may allow more bits to be used for the integer length which may reduce overflows from 33% (FIG. 11B) to 0% (FIG. 12B) for variable u. The increased word length may change bin data, e.g., $2^0$ bin shown by identifier 1290, from a first color (e.g., red) in FIG. 11B to a second color (e.g., dark blue) in FIG. 12B.

Figure 13A:
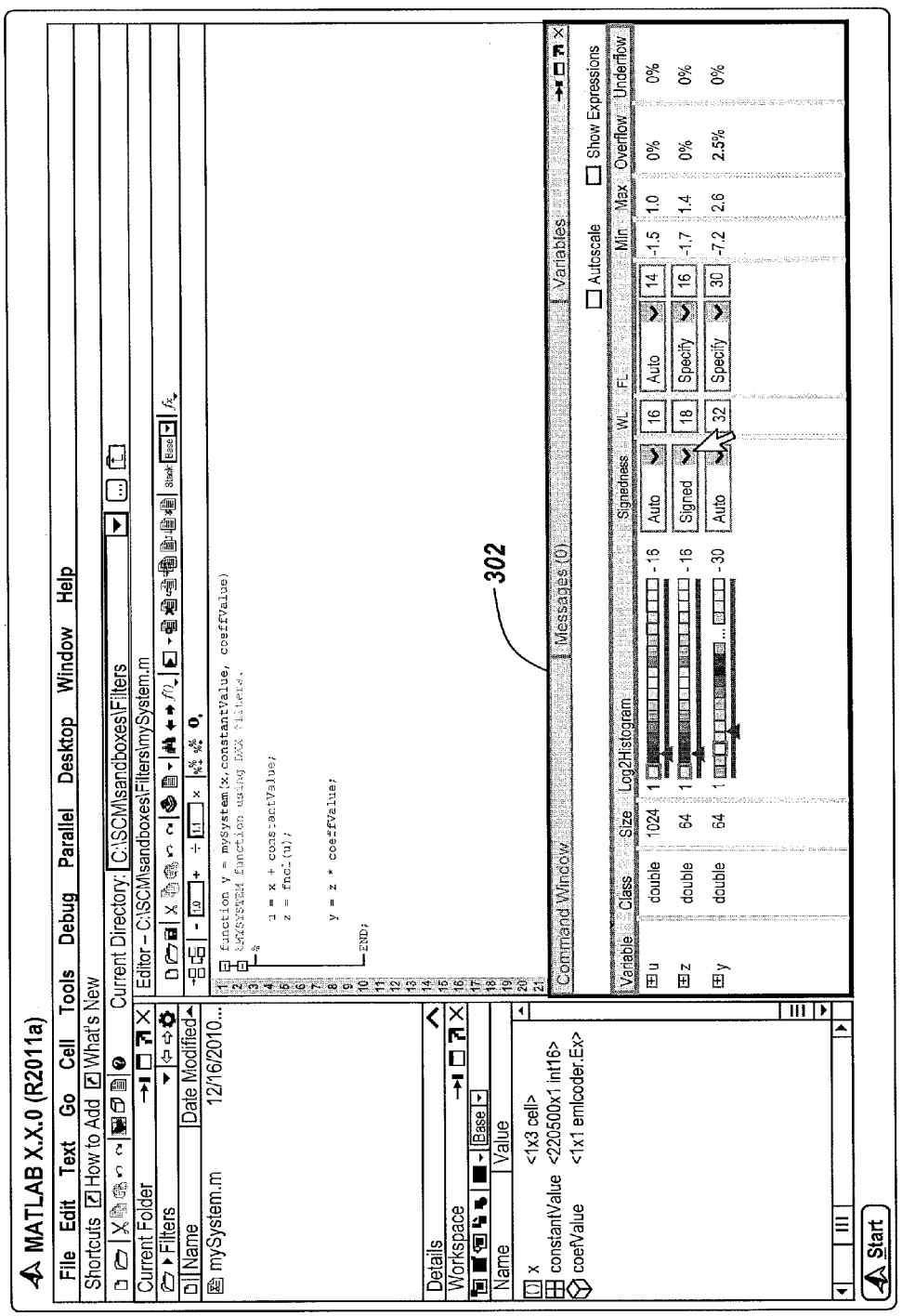
FIGS. 13A and 13B illustrate an exemplary implementation for manipulating a signed bit and for an auto scaling feature of a compact histogram density scale.
Figure 13B:
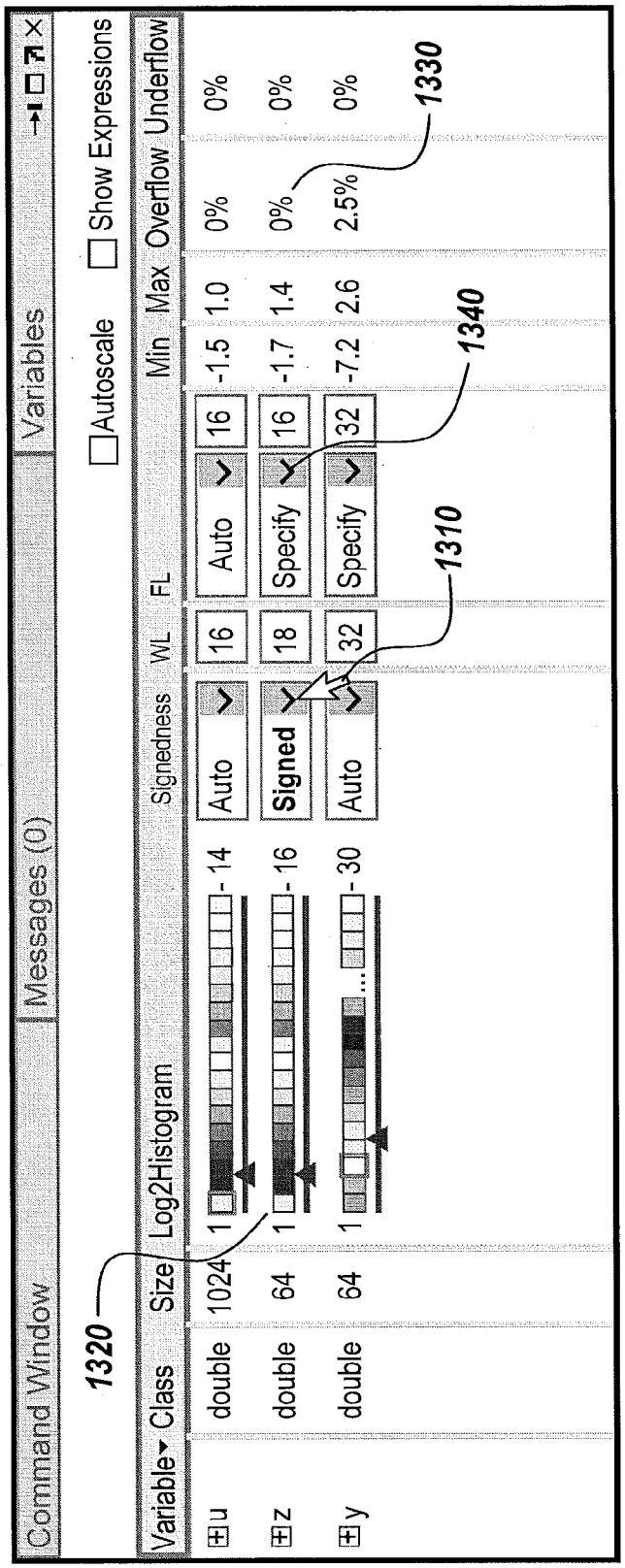

FIG. 13A illustrates an embodiment that allows a user to change signedness and a scaling parameter for a register. FIG. 12B illustrates region 302 of FIG. 12A in greater detail. In FIG. 12B, a user may wish to change parameters for variable z using a pointing device or other input mechanism/technique. A user or computer 110 may determine that negative values for bin $2^0$ and $2^1$ are overflowing in the negative direction when signedness is set to "unsigned" and the fraction length is user specified to be 16 bits (see FIG. 12B). The user may manipulate signedness identifier 1310 and may toggle identifier 1310 to be "signed". Changing identifier 1310 may cause CHDS displays for bins $2^1$ and $2^0$ to be shown as one region instead of a divided region having an upper and lower portion. The user may also toggle identifier 1340 from "specify" to "auto." Prior to toggling identifier 1340, overflows for the register of variable z may be at 12% (identifier 1330), and after toggling the overflows may be 0%.

Figure 14A:
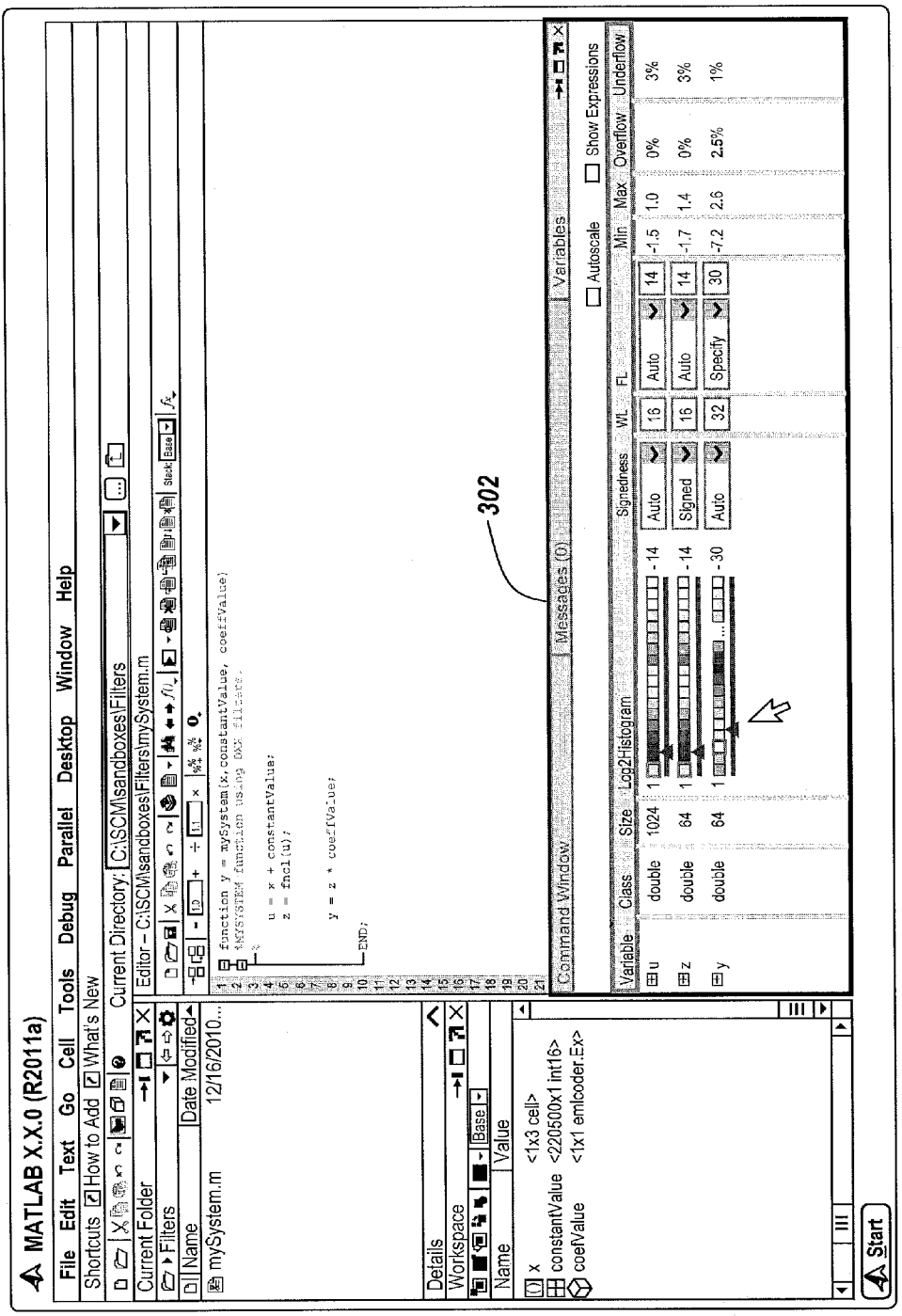
FIGS. 14A and 14B illustrate an exemplary implementation that can be used to eliminate overflows for a fixed point register associated with a compact histogram density scale.
Figure 14B:
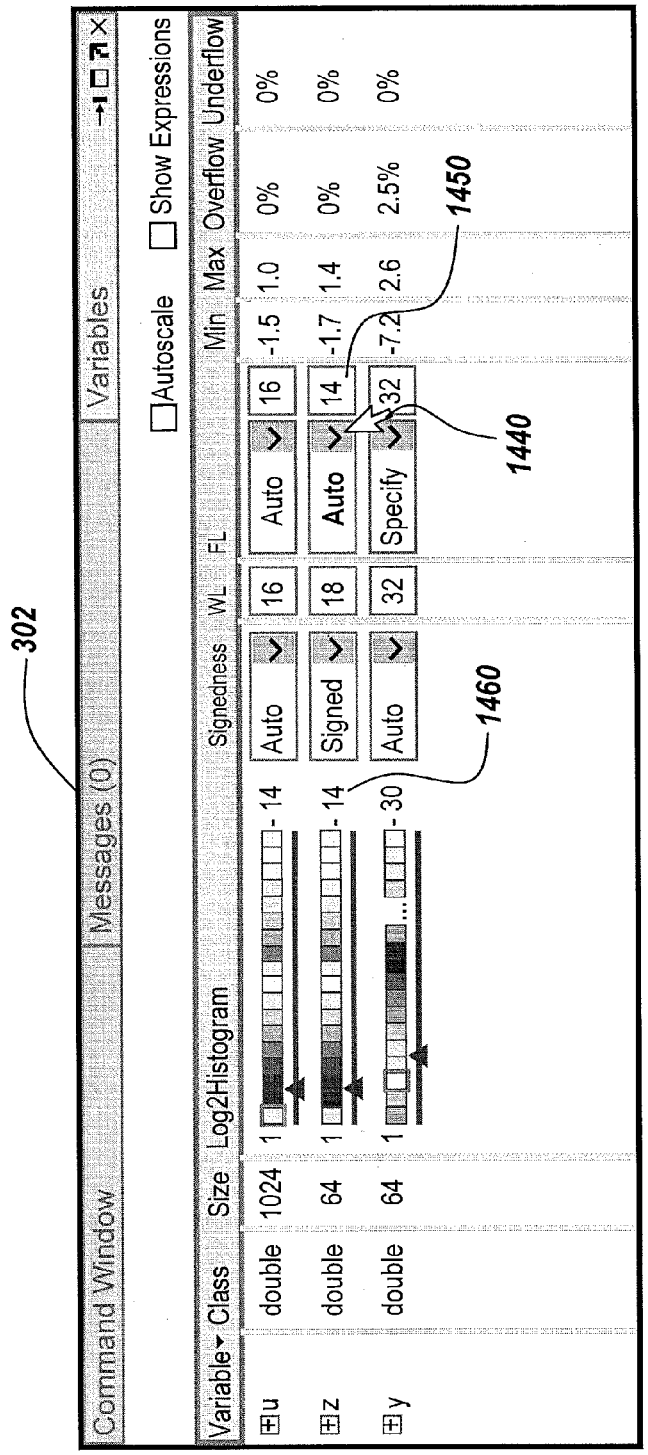

FIG. 14A illustrates an embodiment in which overflows are eliminated for variable z. FIG. 14B illustrates region 302 of FIG. 14A in greater detail. As seen in FIG. 14B, overflows of negative values for variable z are eliminated when the user has set the signedness identifier to signed, the fraction length identifier to auto which shortens the fraction length to 14 as shown by identifiers 1460 and 1450. In the embodiment of FIG. 14B, the word length is reduced to 16 bits. Embodiments allow the user to make modifications to variables while code is executing and registers are being written to or read from.

The embodiment of FIG. 14B can allow a user to perform additional operations on variables, registers, etc. For example, a user may be able to interact with word lengths for a register by manipulating a guide, such as guide 1470. In an embodiment, guide 1470 can become active when a cursor, or other pointing mechanism/technique, is proximate to or otherwise associated with guide 1470.

Figure 15A:
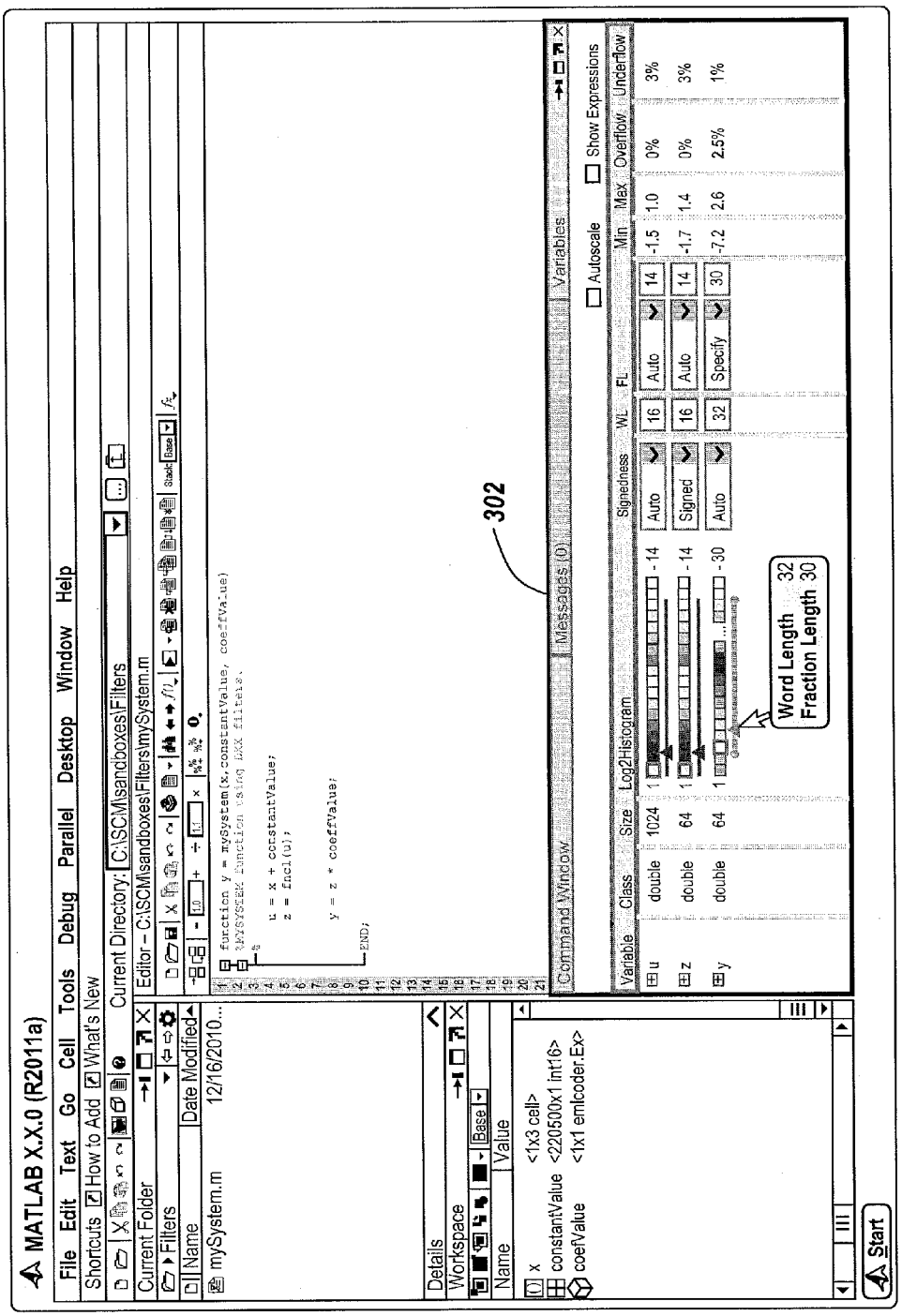
FIGS. 15A and 15B illustrate an exemplary implementation that provides an interactive bin selector for manipulating information associated with a compact histogram density scale.
Figure 15B:
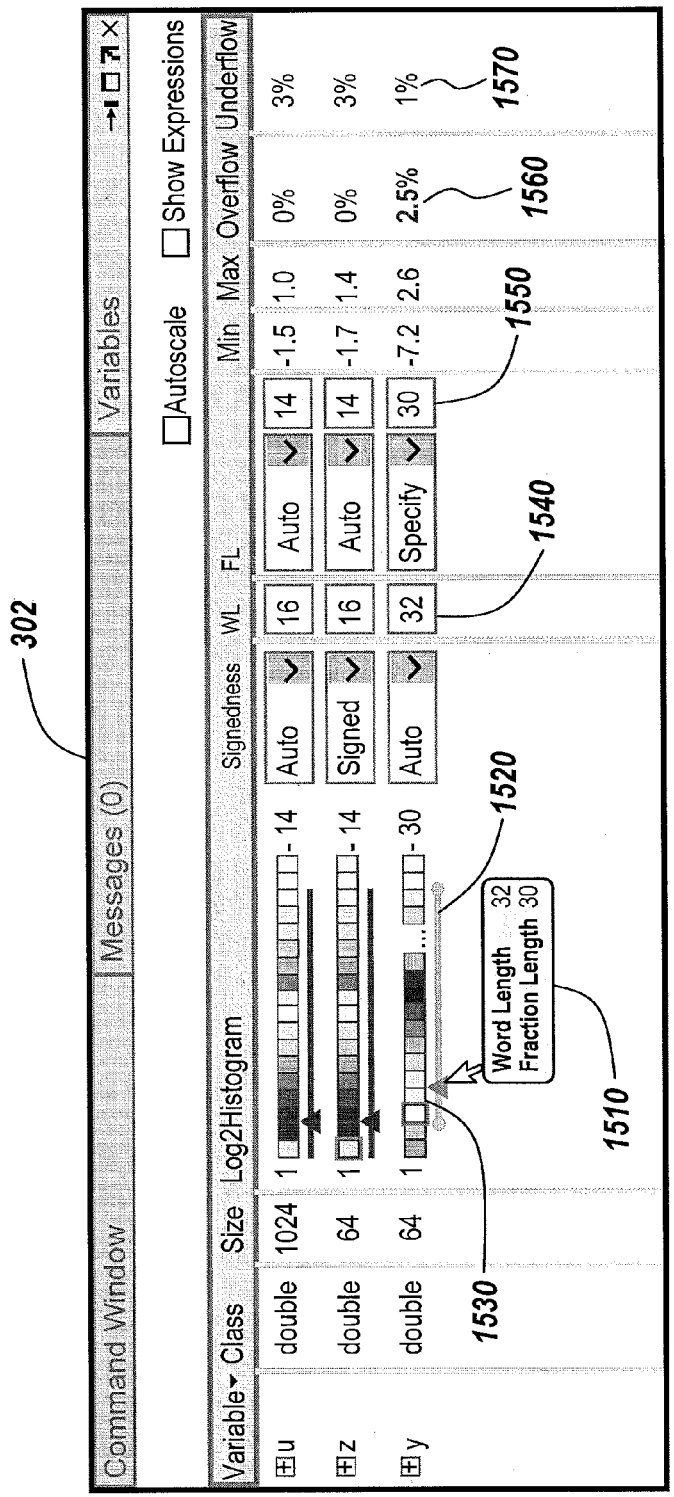

FIG. 15A illustrates an embodiment that allows a user to modify word lengths with respect to bins displayed in region 302. FIG. 15B illustrates region 302 of FIG. 15A in greater detail. A user may wish to graphically manipulate a word length and/or fraction length with respect to a variable, such as variable y. Embodiments may provide the user with tools for interactively manipulating word and fraction lengths while code containing variable y executes.

The user may position a cursor proximate to a register associated with variable y. A guide, such as guide 1470 (FIG. 14B) may change to visually depict an interactive guide 1520 (FIG. 15B). Interactive guide 1520 may allow a user to move guide 1520 to the right or left to change word and/or fraction lengths for variable y. For example, a radix point may be one bin to the right of bin 1530. In this arrangement, a word length may be 32 bits and a fraction length 30 bits. The word length and fraction lengths can also be displayed via word length identifier 1540 and fraction length identifier 1550. The word length and fraction length can be displayed to the user via label window 1510.

Interactive guide 1520 may include end point identifiers, such as dots or other shapes, to delineate the limits of a word size. Embodiments may allow the user to select the end points and move them when desired. Alternatively, interactive guide 1520 may allow the user to move guide 1520 and its end points to the right or left by selecting the center portion of guide 1520. A current configuration of a word and fraction length may produce an overflow indicated by identifier 1560 and an underflow indicated by identifier 1570.

Figure 16A:
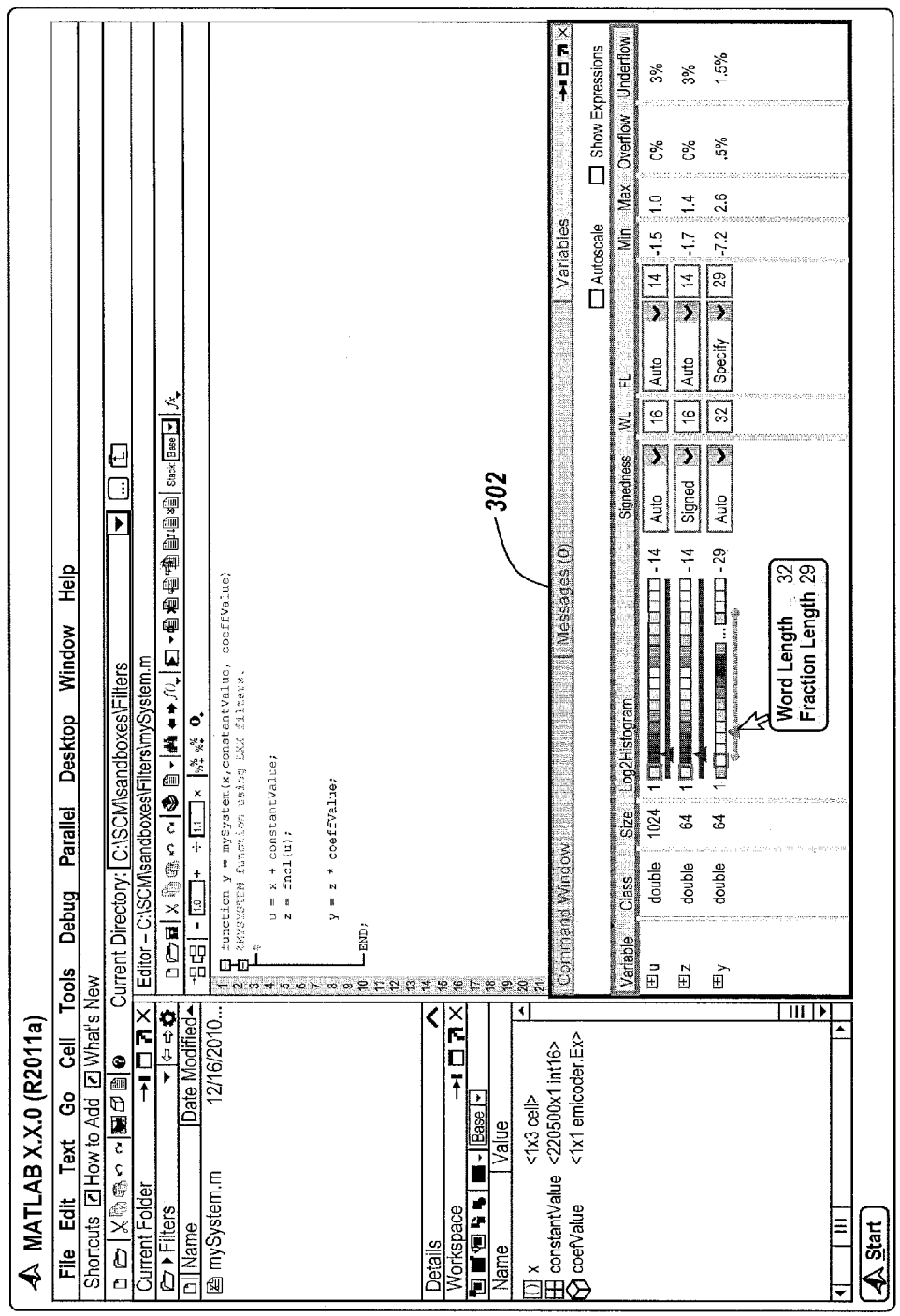
FIGS. 16A and 16B illustrate an exemplary implementation for manipulating a word length via a shifting operation for a compact histogram density scale.
Figure 16B:
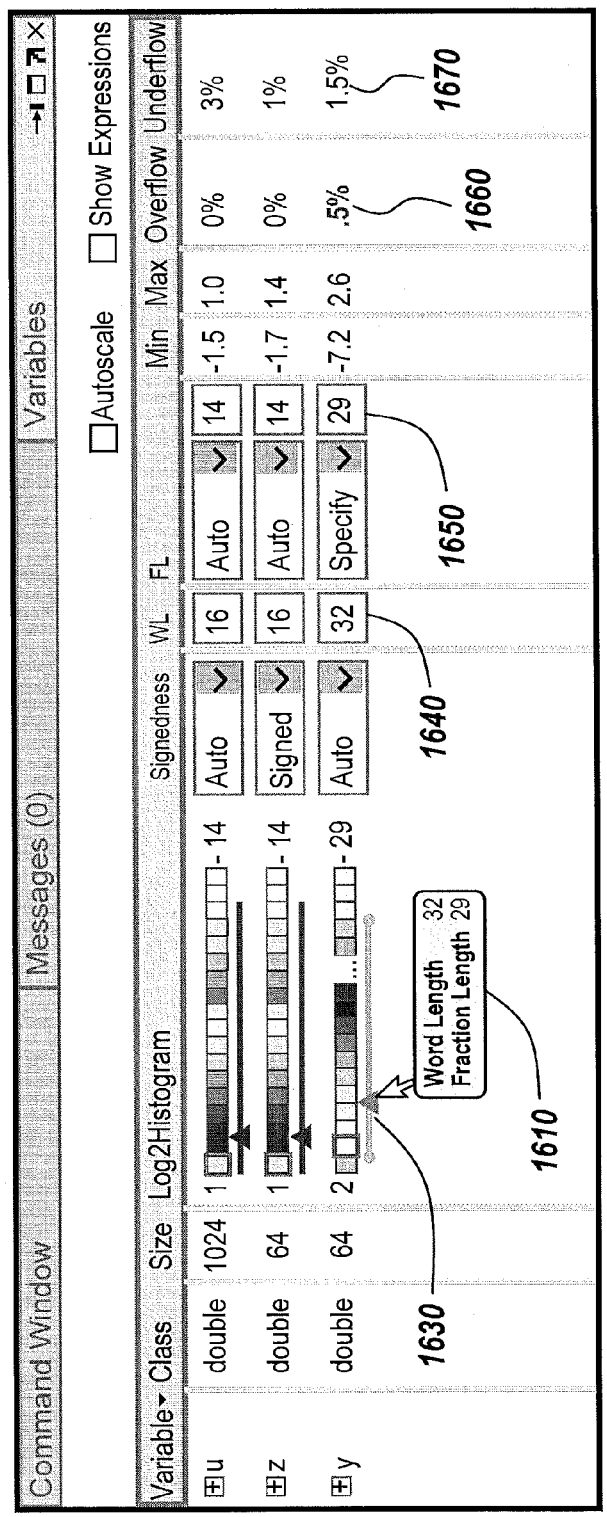

FIG. 16A illustrates an embodiment that allows the user to manipulate a word length and/or fraction length for a variable. FIG. 16B illustrates region 302 of FIG. 16A in greater detail. In FIG. 16B, a user has shifted a word length to the left using guide 1630 in an attempt to reduce overflows. Label window 1610 indicates that the word length has remained at 32 bits and the fraction length has reduced to 29 bits from 30 bits as they were in FIG. 15B prior to dragging the guide. The word length is also indicated by word length identifier 1640 and the fraction length is indicated by fraction length identifier 1650.

Figure 17A:
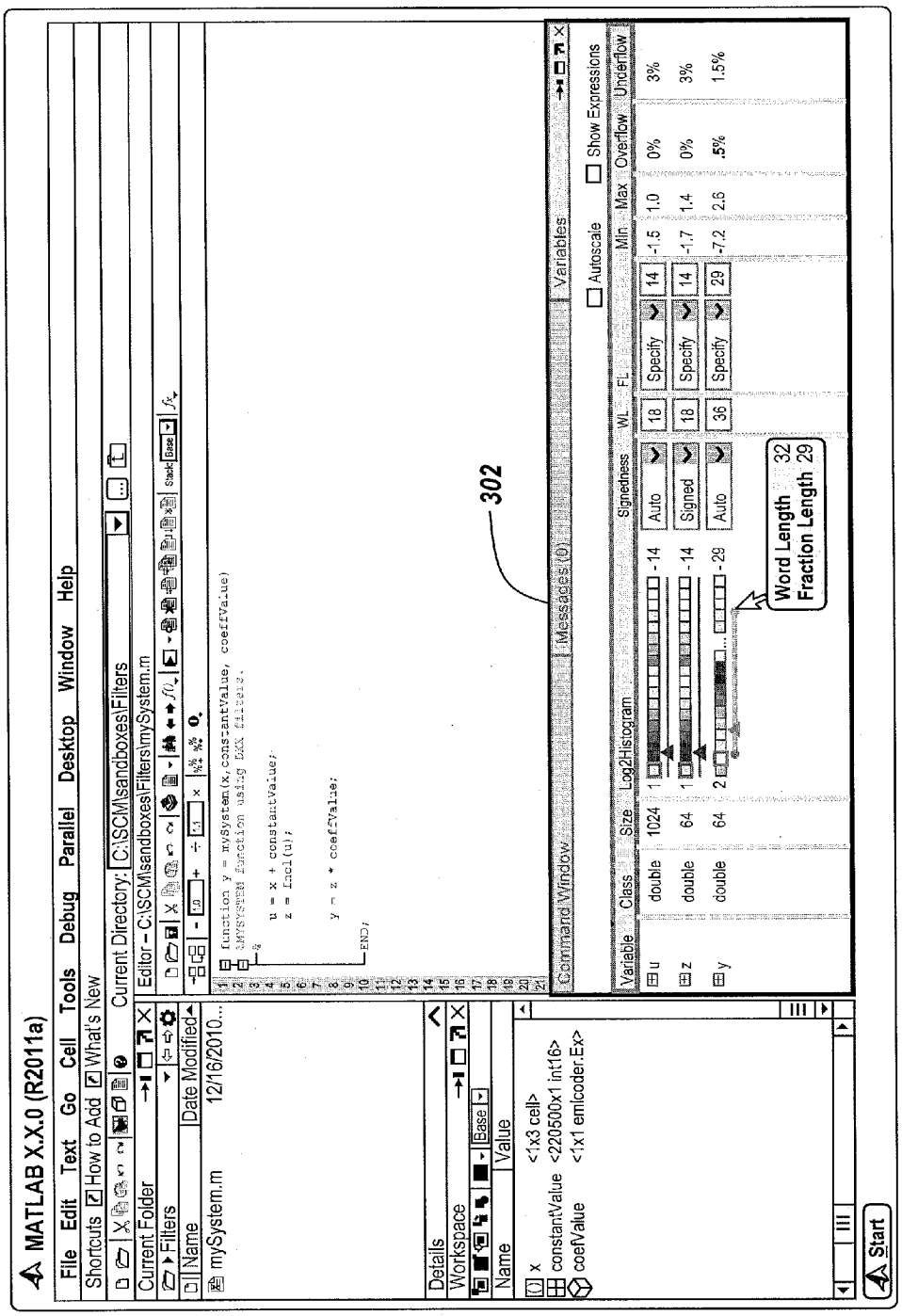
FIGS. 17A-18C illustrate an exemplary implementation that allows for independently changing the word length and the fraction length for a register associated with a compact histogram density scale.
Figure 17B:
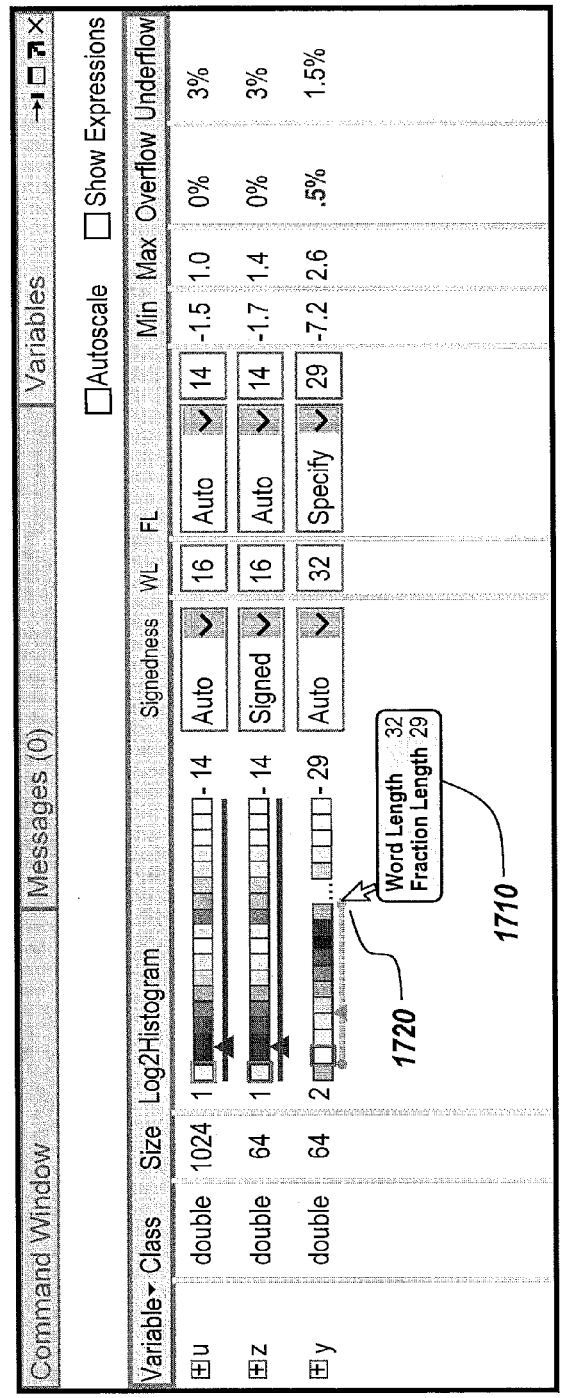
Figure 17C:
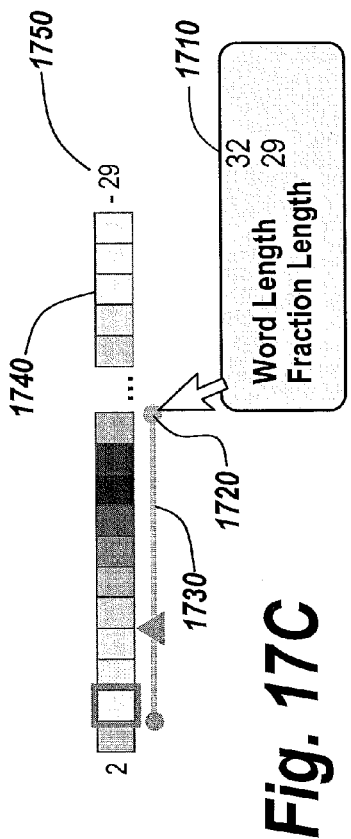

FIG. 17B illustrates an embodiment that allows a fraction length and a word length to change without changing the position of a radix point. FIGS. 17B and 17C illustrate region 302 of FIG. 17A in greater detail. A visual affordance 1720 may be operatively associated with guide 1730 selected using a pointing device and moved from a current location to a new location. A fraction length for variable y may change when affordance 1720 is moved. For example, moving affordance 1720 to the right may increase the fraction length and moving affordance 1720 to the left may decrease the fraction length.

A word length for variable y may be increased or decreased in a manner similar to that used to change a fraction length. Label window 1710 may display a current word length and fraction length that reflects locations of affordance 1720 and affordances for the word length. Bins 1740 may change color, may appear, may disappear, etc., as a user manipulates affordance 1720 to reflect bin counts to the right of the radix point. A fraction length identifier 1750 may also change as a user manipulates affordance 1720.

Figure 18A:
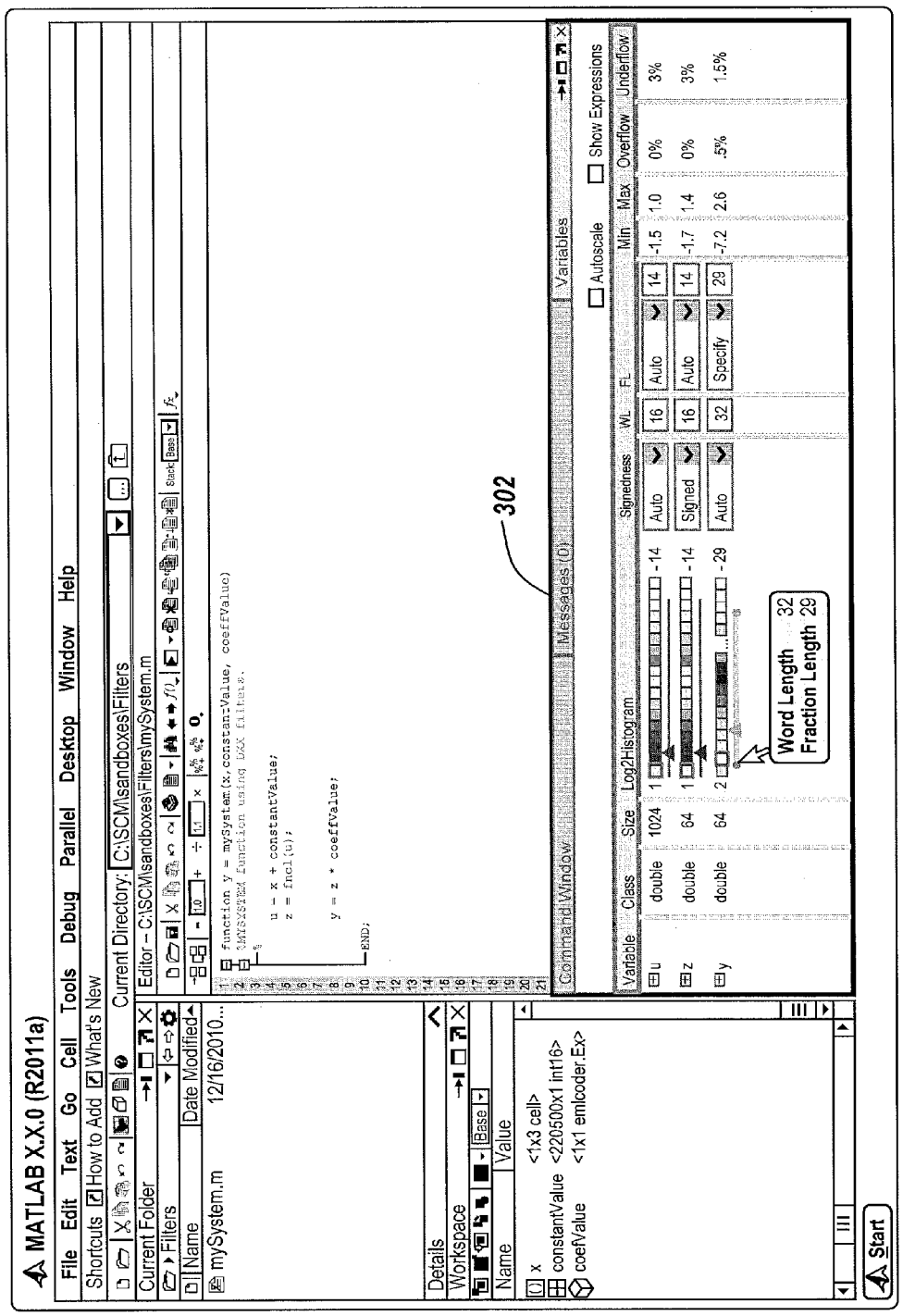
Figure 18B:
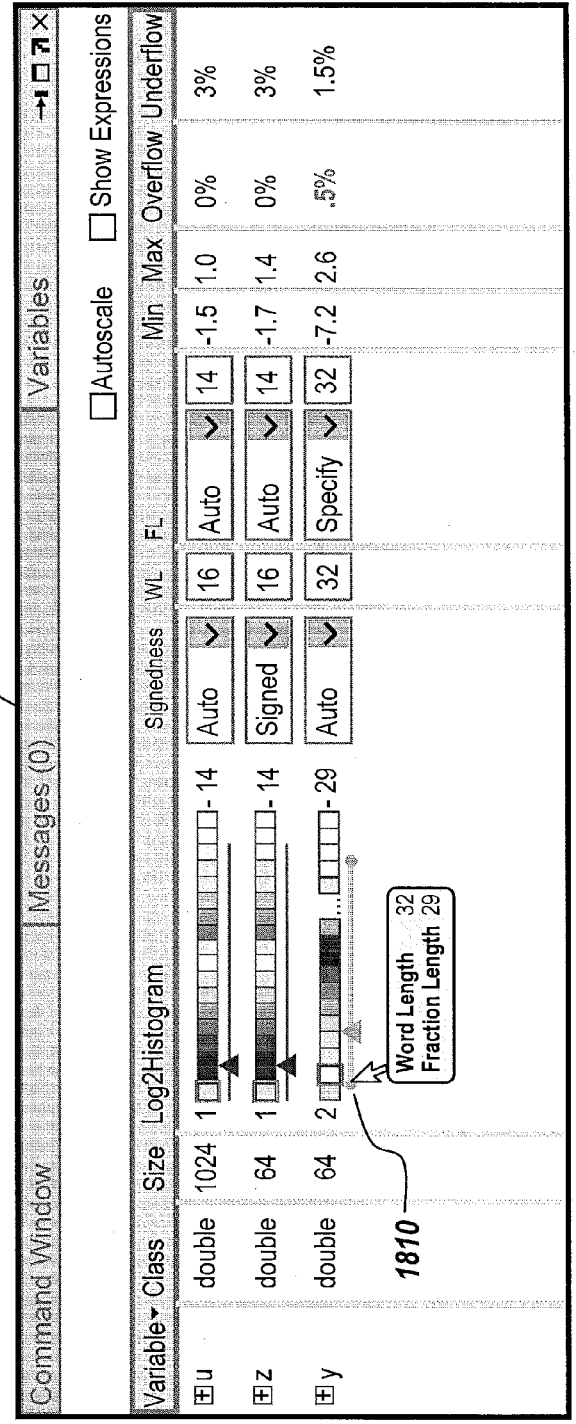
Figure 18C:
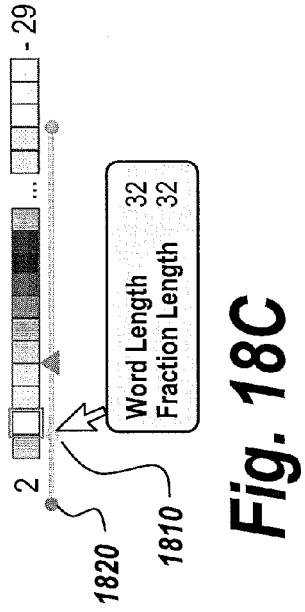

FIG. 18A illustrates an embodiment that allows for resizing an integer length in response to a command. FIG. 18B illustrates region 302 of FIG. 18A in greater detail. A user may select affordance 1810 to resize an integer length for variable y. For example, a user may select affordance 1810 and move affordance 1810 to the right or to the left using a pointing device. Changing an integer length for variable y may also change a word length. In the embodiment of FIG. 18B, resizing the integer length may not affect a fraction length.

Exemplary Processing

Figure 19:
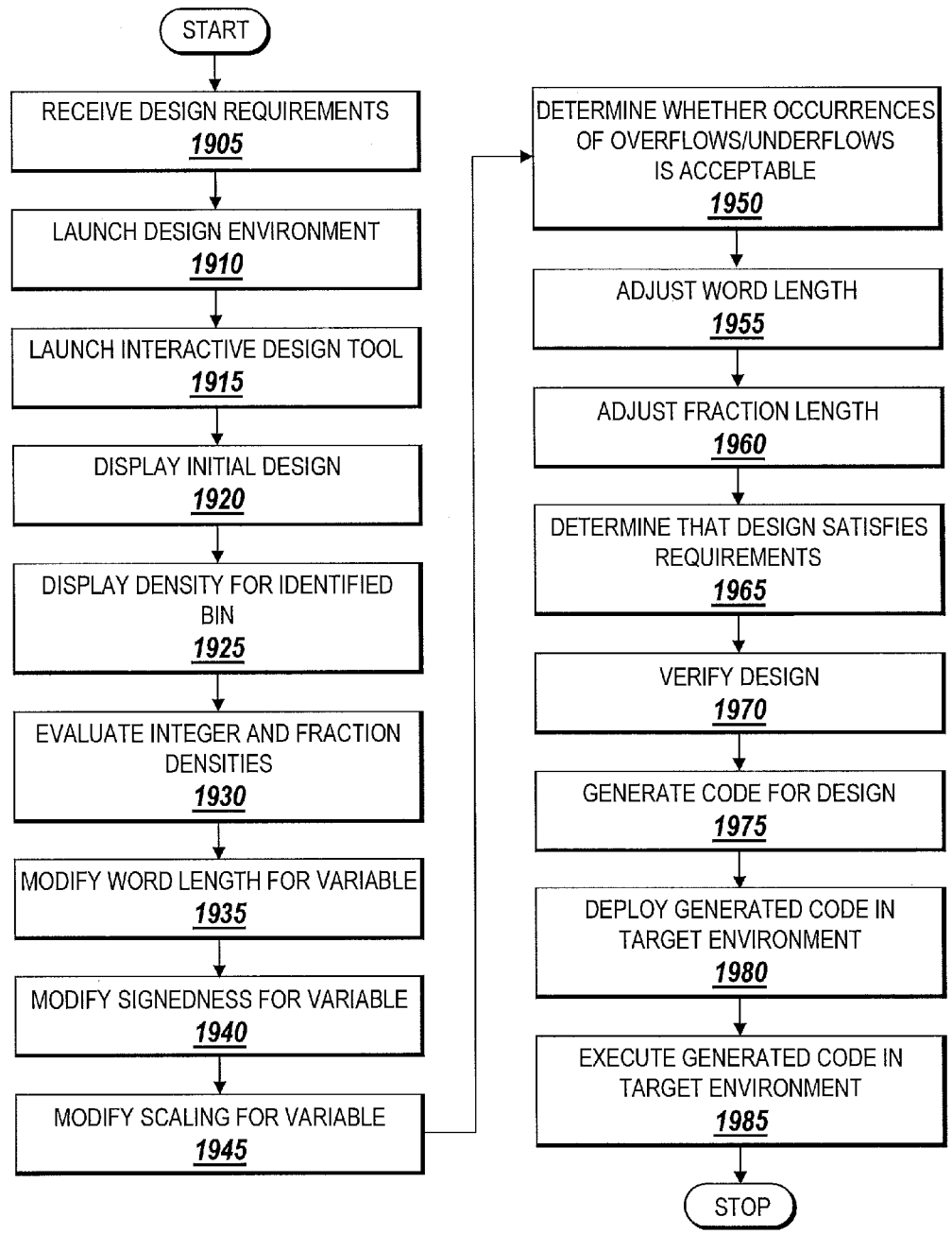
FIG. 19 illustrates exemplary processing that can be used for implementing aspects of the invention.

FIG. 19 illustrates exemplary processing for practicing an embodiment of the invention. Computer 110 may receive design requirements via simulation environment 120 (act 1905). Design requirements may specify parameters for the design of an embedded system that makes use of one or more storage mechanisms for storing information. A user may launch an interactive design environment on computer 110 (act 1910). For example, the user may launch an interactive design tool that supports CHDSs for depicting data associated with registers of the embedded system (act 1915). The design tool may allow the user to interactively manipulate register characteristics while code for the embedded system executes.

An initial design for the embedded system may be displayed using the interactive design tool (act 1920). In an embodiment, the design may include executable source code that contains variables that store information in the registers. The user may execute the code in a simulation and the interactive design tool may display density information for a bin of a register (act 1925). The user or computer 110 may evaluate density information for one or more bins of the register. For example, density information for an integer portion and fraction portion of the register may be evaluated (act 1930).

The user may determine that a word length for a variable is inadequate. For example, the user may determine that a bin includes an inacceptable number of overflows. The user may interactively modify a word length for the variable while the program code executes (act 1935). Embodiments may support modifying word lengths without affecting underlying data produced by executing code or embodiments can be configured to manipulate program code based on a user's interactions with a CHDS tool. While program code executes, the user may determine that signedness for the variable should be modified. For example, the user or computer 110 may determine that the signedness should be changed from "auto" to "signed". The user may interactively modify the signedness for the variable using a pointing device (act 1940). The user may observe how characteristics of bins making up the register for a variable change based on the modified signedness for the variable.

The user or computer 110 may determine that scaling for a variable should be modified and may modify scaling for the variable using the design tool (act 1945). A determination may be made as to whether occurrences of overflows and/or underflows are acceptable (act 1950). In a first embodiment, computer 110 may programmatically determine whether occurrences of overflows/underflows are acceptable by comparing measured overflows/underflows with threshold values that identify acceptable counts.

In a second embodiment, a user may visually inspect colors, shading, etc., associated with register bins to determine whether counts for overflows and/or underflows are acceptable. Adjustments may be made to a word length for a variable when overflow/underflow rates are unacceptable (act 1955). Alternatively, or in addition to adjusting a word length, an embodiment may adjust a fraction length for the variable to modify overflow/underflow occurrences (act 1960).

When adjustments have been made to registers storing information associated with variables in executed code, it may be determined whether a design satisfies design requirements (act 1965). A design may be verified using verification techniques when the design satisfies design requirements (act 1970). A verified design may be deemed acceptable for a deployed application, such as deployment in an embedded system that includes one or more registers.

Code may be generated for a design using code generation techniques (act 1975). Generated code may be tested and/or verified before deploying the generated code in a target environment 130. When generated code is determined to be satisfactory, the generated code can be deployed in target environment 130 (act 1980). Target environment 130 may execute the generated code to perform operations (act 1985).

Exemplary embodiments can be configured to provide a user with recommendations as to how code should be changed to achieve desired operation with registers. For example, a user may manipulate aspects of fixed point registers using a CHDS tool as floating point program code executes. The user may settle on a register size and configuration that satisfies design requirements in terms of underflows and overflows. The CHDS tool may provide the user with recommendations on portions of program code that should be changed in order to achieve the desired fixed point operation. For example, the tool may recommend that the data type of a variable "x" be changed to a certain fixed-point type. A user may choose to accept the recommendation and may apply the recommendation to the program code so that variable x is set to the recommended fixed-point data type in the code.

By way of example, a user may work with a program code of a model that includes numeric types that are software objects configured to hold signed/unsigned information, a word length, and a fraction length. These numeric type objects may be stored in a workspace as program code executes. The CHDS tool may create a new data dictionary based on operation of the program code and the changed numeric type objects in the workspace. The CHDS tool may allow the user to accept the new data dictionary so that the new data dictionary can be used with subsequent execution of the program code. Use of the new data dictionary may allow the program code to satisfy a design requirement with respect to registers used in the model.

Exemplary Architecture

Figure 20:
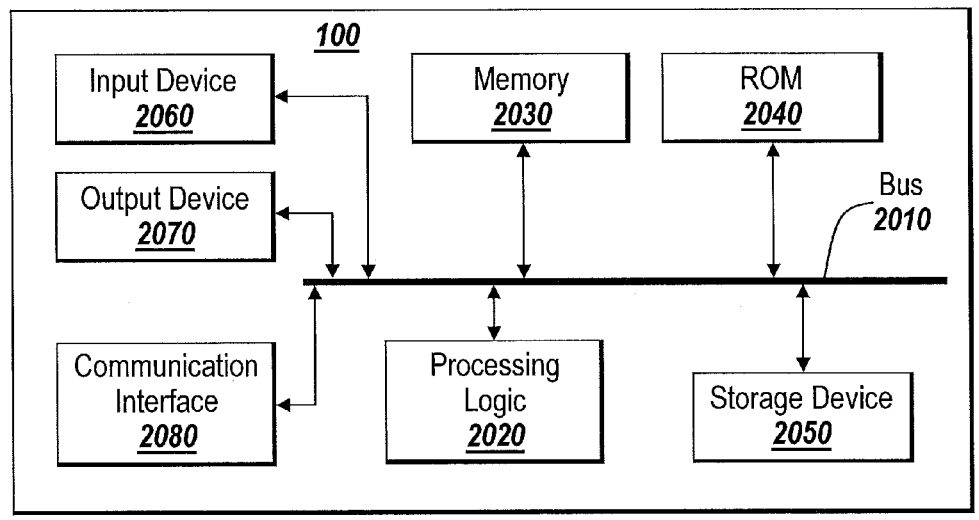
FIG. 20 illustrates an exemplary architecture for implementing embodiments of the invention in computational devices.

FIG. 20 illustrates an exemplary computer architecture that can be used to implement computer 110 of FIG. 1. FIG. 20 is an exemplary diagram of an entity corresponding to computer 110. As illustrated, the entity may include a bus 2010, processing logic 2020, a main memory 2030, a read-only memory (ROM) 2040, a storage device 2050, an input device 2060, an output device 2070, and/or a communication interface 2080. Bus 2010 may include a path that permits communication among the components of the entity.

Processing logic 2020 may include a processor, microprocessor, or other types of processing logic (e.g., FPGA, GPU, DSP, ASIC, etc.) that may interpret and execute instructions. For an implementation, processing logic 2020 may include a single core processor or a multi-core processor. In another implementation, processing logic 2020 may include a single processing device or a group of processing devices, such as a processing cluster or computing grid. In still another implementation, processing logic 2020 may include multiple processors that may be local or remote with respect each other, and may use one or more threads while processing.

Main memory 2030 may include a random access memory (RAM) or another type of dynamic storage device that may store information and instructions for execution by processing logic 2020. ROM 2040 may include a ROM device or another type of static storage device that may store static information and/or instructions for use by processing logic 2020. Storage device 2050 may include a magnetic, solid state and/or optical recording medium and its corresponding drive, or another type of static storage device that may store static information and/or instructions for use by processing logic 2020.

Input device 2060 may include logic that permits an operator to input information to the entity, such as a keyboard, a mouse, a pen, a touchpad, an accelerometer, a microphone, voice recognition, camera, neural interface, biometric mechanisms, etc. In an embodiment, input device 2060 may correspond to input device 125.

Output device 2070 may include a mechanism that outputs information to the operator, including a display, a printer, a speaker, a haptic interface, etc. In an embodiment, output device 2070 may correspond to display device coupled to computer 110. Communication interface 2080 may include any transceiver-like logic that enables the entity to communicate with other devices and/or systems. For example, communication interface 2080 may include mechanisms for communicating with another device or system via a network.

The entity depicted in FIG. 20 may perform certain operations in response to processing logic 2020 executing software instructions stored in a computer-readable storage medium, such as main memory 2030. A computer-readable storage medium may be defined as a physical or logical memory device. The software instructions may be read into main memory 2030 from another computer-readable storage medium, such as storage device 2050, or from another device via communication interface 2080. The software instructions contained in main memory 2030 may cause processing logic 2020 to perform techniques described herein when the software instructions are executed on processing logic. Alternatively, hardwired circuitry may be used in place of or in combination with software instructions to implement techniques described herein. Thus, implementations described herein are not limited to any specific combination of hardware circuitry and software.

Although FIG. 20 shows exemplary components of the entity, in other implementations, the entity may contain fewer, different, or additional components than depicted in FIG. 20. In still other implementations, one or more components of the entity may perform one or more tasks described as being performed by one or more other components of the entity.

Exemplary Distributed Embodiment

Distributed embodiments may perform processing using two or more processing resources. For example, embodiments can perform processing using two or more cores in a single processing device, distribute processing across multiple processing devices installed within a single enclosure, and/or distribute processing across multiple types of processing logic connected by a network.

Figure 21:
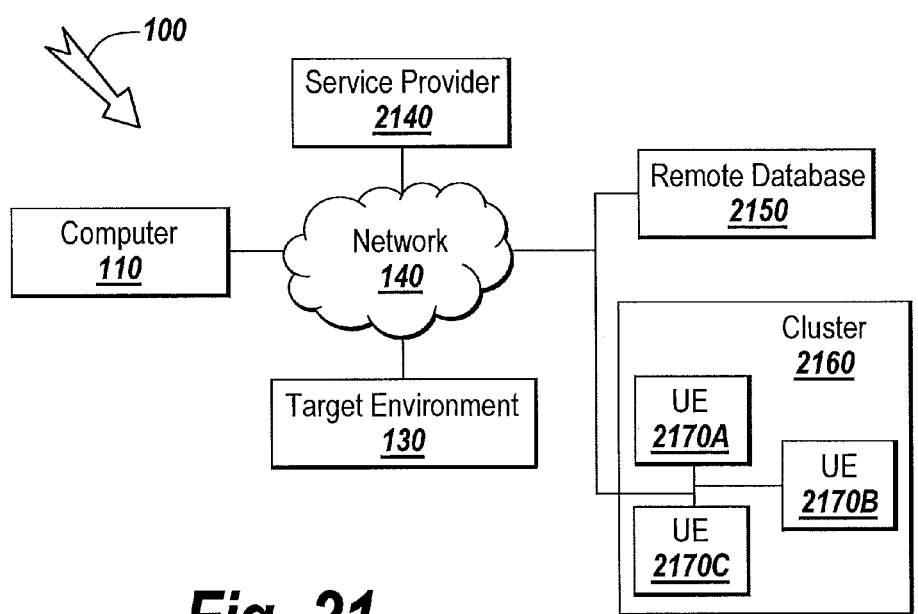
FIG. 21 illustrates an exemplary system for implementing a distributed implementation of the invention.

FIG. 21 illustrates an exemplary system that can support distributed design and/or modeling applications that make use of storage mechanisms. System 2100 may include computer 110, network 140, service provider 2140, and cluster 2160. The implementation of FIG. 21 is exemplary and other distributed implementations of the invention may include more devices and/or entities, fewer devices and/or entities, and/or devices/entities in configurations that differ from the exemplary configuration of FIG. 21.

Service provider 2140 may include a device that makes a service available to another device. For example, service provider 2140 may include an entity that provides one or more services to a destination using a server and/or other devices. Services may include instructions that are executed by a destination to perform an operation. Alternatively, a service may include instructions that are executed on behalf of a destination to perform an operation on the destination's behalf.

Assume, for sake of example, that a service provider operates a web server that provides one or more web-based services to a destination, such as computer 110. The web-based services may allow computer 110 to perform CHDS assisted design and/or analysis activities. For example, a user of computer 110 may be allowed to evaluate the performance of registers used by models side-by-side using the service provider's hardware. In an implementation, a customer (user) may receive services on a subscription basis. A subscription may include substantially any type of arrangement, such as monthly subscription, a per-use fee, a fee based on an amount of information exchanged between service provider 2140 and the customer, a fee based on a number of processor cycles used by the customer, a fee based on a number of processors used by the customer, etc.

Cluster 2160 may include a group of processing devices, such as units of execution 2170 that can be used to perform remote processing (e.g., distributed processing, parallel processing, etc.). Units of execution 2170 may include hardware and/or hardware/software based devices that perform processing operations on behalf of a requesting device, such as computer 110. In an embodiment, units of execution 2170 may each compute a partial result and the partial results can be combined into an overall result for a model.

Embodiments operating in a standalone or in a distributed implementation can perform activities described herein on code/results associated with text-based computing and/or modeling applications, such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim.

Embodiments can further perform activities described herein on code/results associated with graphical modeling environments, such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from International Business Machines (IBM) Corporation; Ptolemy from the University of California at Berkeley; ASCET, CoWare, or aspects of a Unified Modeling Language (UML) or SysML environment. Graphical modeling environments can include block diagrams and/or other types of diagrams.

Embodiments may be implemented in a variety computing environments, such as environments that support statically or dynamically typed programming languages. For example, a dynamically typed language may be one used to express problems and/or solutions in mathematical notations familiar to those of skill in the relevant arts. For example, the dynamically typed language may use an array as a basic element, where the array may not require dimensioning. These arrays may be used to support array programming in that operations can apply to an entire set of values, such as values in an array. Array programming may allow array based operations to be treated as a high-level programming technique or model that lets a programmer think and operate on whole aggregations of data without having to resort to explicit loops of individual non-array, i.e., scalar operations. An exemplary embodiment that uses a dynamically typed language may be implemented in the Embedded MATLAB programming language that can be used to create code for use in embedded applications.

CONCLUSION

Implementations may allow users to interactively design configure and/or analyze storage mechanisms while program code that interacts with the storage mechanisms executes.

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, while a series of acts has been described with regard to FIG. 19, the order of the acts may be modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. For example, devices and/or entities may be added and/or removed from the implementations of FIGS. 1, 20 and 21 depending on specific deployments and/or applications. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

Headings and sub-headings used herein are to aid the reader by dividing the specification into subsections. These headings and sub-headings are not to be construed as limiting the scope of the invention or as defining the invention.

The scope of the invention is defined by the claims and their equivalents.

What is claimed is:

1. One or more non-transitory computer-readable media, storing:
   one or more instructions that, when executed by a processor of a device, cause the processor to:
      execute program code using the processor, the program code:
         creating a first representation, the first representation representing a first storage mechanism, the first storage mechanism having bins, and
         creating a second representation, the second representation representing a second storage mechanism, the second storage mechanism having bins;
      determine values for data written to the bins of the first storage mechanism;
      determine values for data written to the bins of the second storage mechanism;
      represent the data values for the bins of the first storage mechanism and the data values for the bins of the second storage mechanism using a compact histogram density scale (CHDS);
      displaying the CHDS for the first storage mechanism using the first representation; and
      displaying the CHDS for the second storage mechanism using the second representation.

2. The one or more computer-readable media of claim 1, where the first storage mechanism is a register of bits representing a scaled integer.

3. The one or more computer-readable media of claim 1, where the program code is MATLAB-compatible program code or Simulink-compatible program code.

4. The one or more computer-readable media of claim 1, where the one or more instructions further cause the processor to:
   interact with a code generator, the code generator for generating code for the program code.

5. The one or more computer-readable media of claim 1, where the first representation represents one or more of:
   a word length for the first storage mechanism,
   a fraction length for the first storage mechanism,
   an integer length for the first storage mechanism, or
   a size of the first storage mechanism.

6. The one or more computer-readable media of claim 1, where the one or more instructions further cause the processor to:
   display a bin window proximate to a bin identifier for the first representation.

7. One or more non-transitory computer-readable media, storing:
   one or more instructions that, when executed by a processor of a device, cause the processor to:
      display a compact histogram density scale (CHDS), where the CHDS includes:
         a plurality of display bins corresponding to bins of a storage mechanism holding values, the values associated with executing program code;
         a first intensity, the first intensity:
            representing a number of occurrences of a value for a first bin of the bins of the storage mechanism; and
         a color, the color:
            reflecting the value for the first bin of the storage mechanism, the value being relative to a threshold associated with the storage mechanism; and
      update the CHDS based on the executing program code, the updating comprising:
         displaying a second intensity, the second intensity differing from the first intensity.

8. The one or more computer-readable media of claim 7, where the one or more instructions further cause the processor to change one or more of:
   a word length for the storage mechanism, or
   a fraction length for the storage mechanism.

9. The one or more computer-readable media of claim 7, where the one or more instructions further cause the processor to:
   modify a word length or a fraction length for a displayed representation of the storage mechanism, the displayed representation containing the CHDS.

10. The one or more computer-readable media of claim 7, where the one or more instructions further cause the processor to:
    change a word length or a fraction length with respect to a radix point.

11. The one or more computer-readable media of claim 7, where the one or more instructions further cause the processor to:
    display a guide proximate to the displayed plurality of display bins; and
    resize one or more of a word length, a fraction length, an integer length, or a bin identifier size.

12. The one or more computer-readable media of claim 7, where the program code is MATLAB-compatible program code or Simulink-compatible program code.

13. A computer-implemented method, comprising:
receiving, using a processor, an instruction, where the instruction:
is associated with a register representation, where:
the register representation includes a plurality of bins, and
the plurality of bins includes a compact histogram density scale (CHDS) that represents a number of occurrences of data values, where the data values are associated with respective ones of the plurality of bins, determines a characteristic of the register representation, and
is received by the computer; and
displaying the register representation on a display device, where:
the displayed register representation reflects the characteristic.

14. The method of claim 13, further comprising:
receiving, using the processor, a debug instruction, where the debug instruction is associated with a debugger operating on program code that generates the data values.

15. The method of claim 13, where the data values are associated with executing program code, the method comprising:
interacting with a code generator, the code generator for generating code from the program code.

16. The method of claim 15, where the generated code is for an embedded system, the embedded system including a storage mechanism corresponding to the register.

17. The method of claim 13, where the instruction is used with a MATLAB-compatible environment or a Simulink-compatible environment.

18. The method of claim 13, further comprising:
generating code when information in the displayed plurality of bins satisfies a design requirement.

19. The method of claim 18, further comprising:
executing the generated code.

20. A device, comprising:
a storage mechanism to:
store data values, the data values associated with bins; and
a processor to:
interact with the data values in the storage mechanism,
interact with a visual representation, the visual representation representing the bins of the storage mechanism on a display device,
display an intensity in one or more of the bins represented in the visual representation, the intensity representing a number of occurrences for a data value as program code executes, and
use an identifier to represent the data value in the one or more bins of the visual representation as the program code executes, the identifier and the intensity forming a compact histogram density scale (CHDS) when displayed on the display device.

* * * * *